(12) United States Patent
Morimoto et al.

(10) Patent No.: US 7,634,022 B2
(45) Date of Patent: Dec. 15, 2009

(54) POLAR MODULATOR AND WIRELESS COMMUNICATION APPARATUS USING THE SAME

(75) Inventors: Shigeru Morimoto, Osaka (JP); Toru Matsuura, Osaka (JP); Hisashi Adachi, Osaka (JP)

(73) Assignee: Panasonic Corporation, Osaka (JP)

( * ) Notice: Subject to any disclaimer, the term of this patent is extended or adjusted under 35 U.S.C. 154(b) by 547 days.

(21) Appl. No.: 10/591,811

(22) PCT Filed: Jan. 6, 2006

(86) PCT No.: PCT/JP2006/300322

§ 371 (c)(1),
(2), (4) Date: Sep. 6, 2006

(87) PCT Pub. No.: WO2006/073208

PCT Pub. Date: Jul. 13, 2006

(65) Prior Publication Data

US 2007/0205843 A1  Sep. 6, 2007

(30) Foreign Application Priority Data

Jan. 6, 2005  (JP) .............................. 2005-001200

(51) Int. Cl.
*H04K 1/02* (2006.01)

(52) U.S. Cl. .................. 375/296; 332/115; 330/279; 375/297

(58) Field of Classification Search ............. 375/296, 375/297, 300, 312, 268; 300/279, 264, 277, 300/30; 332/123, 145, 149, 159–162, 108, 332/115.1, 115.4, 126; 455/108, 115.1, 115.4, 455/126; 330/279, 264, 277, 30
See application file for complete search history.

(56) References Cited

U.S. PATENT DOCUMENTS 6,242,975 B1 *  6/2001  Eidson et al. ........... 330/124 R (Continued)

FOREIGN PATENT DOCUMENTS

WO  2004/019486  3/2004

OTHER PUBLICATIONS

Mann S et al: "Increasing the Talk-Time of Mobile Radios With Efficient Linear Transmitter Architectures" Electronics and Communication Engineering Journal, Institution of Electrical Engineers, London, GB, vol. 13, No. 2, Apr. 2001, pp. 65-76, XP001058796.

*Primary Examiner*—David C Payne
*Assistant Examiner*—Rahel Guarino
(74) *Attorney, Agent, or Firm*—Wenderoth, Lind & Ponack, L.L.P.

(57) ABSTRACT

A phase modulation section (101) generates a first modulated signal including phase information. An amplitude signal control section (103) generates a second modulated signal including amplitude information. A waveform shaping section (104), when an amplitude of the second modulated signal is larger than a regulated value generates a waveform-shaped modulated signal. An amplitude modulated voltage supply section (105) amplifies the waveform-shaped modulated signal based on the supply voltage from a voltage control section (106) and supplies the amplified signal to a power amplification section (102). The power amplification section (102) amplifies the first modulated signal based on the amplitude modulated voltage, and outputs the resultant signal. The waveform shaping section (104) adjusts the regulated value in accordance with a factor for changing a distorted power generated by the power amplification section (102), such that an ACP generated by the power amplification section (102) becomes a first predetermined value or smaller.

31 Claims, 24 Drawing Sheets

U.S. PATENT DOCUMENTS

| | | |
|---|---|---|
| 6,528,975 B2 | 3/2003 | Sander |
| 6,922,550 B1 * | 7/2005 | van Rumpt ................ 455/102 |
| 7,251,462 B2 * | 7/2007 | Matsuura et al. ............ 455/108 |
| 2004/0219891 A1 * | 11/2004 | Hadjichristos .............. 455/102 |
| 2005/0008093 A1 | 1/2005 | Matsuura et al. |
| 2005/0242880 A1 * | 11/2005 | Domokos et al. ........... 330/280 |

* cited by examiner

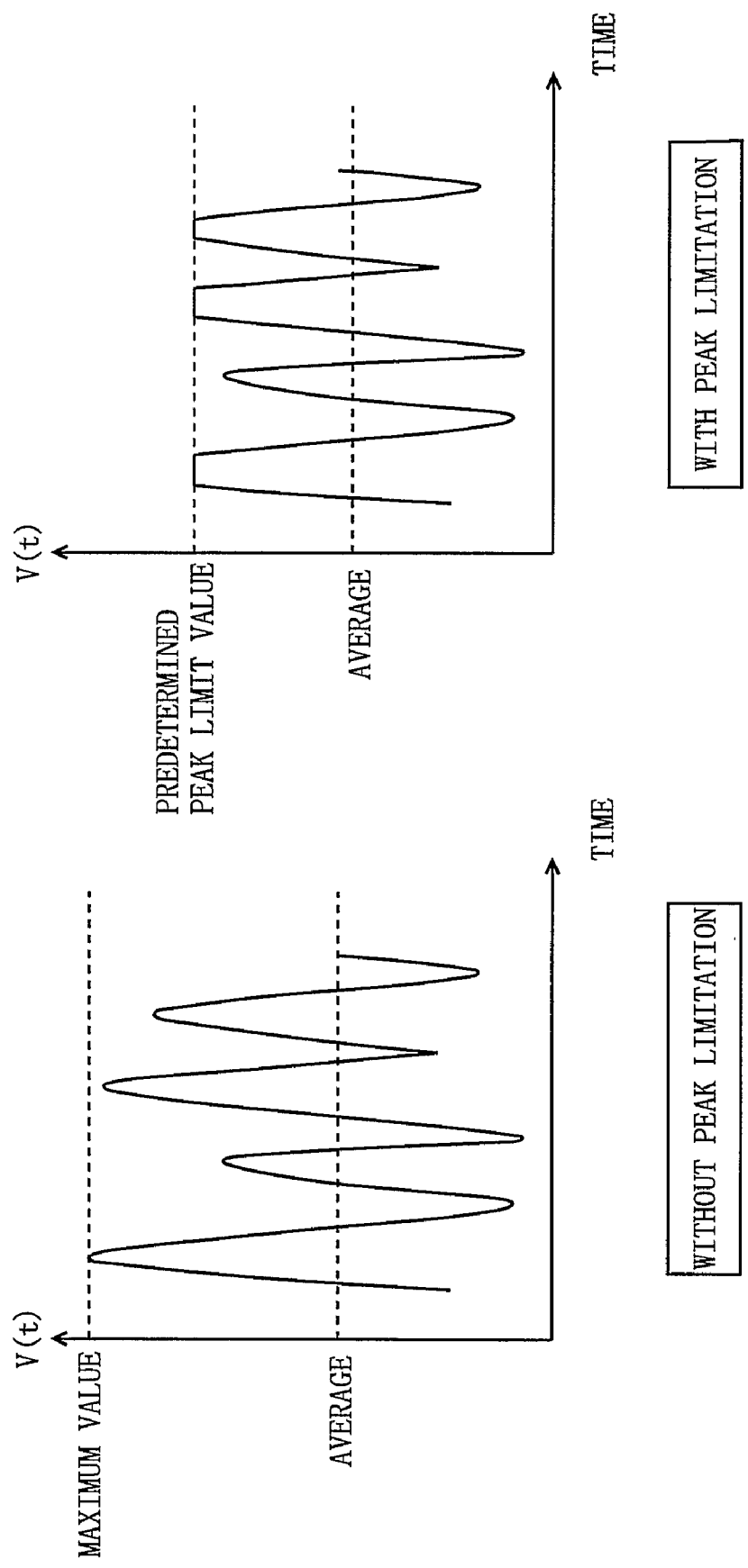

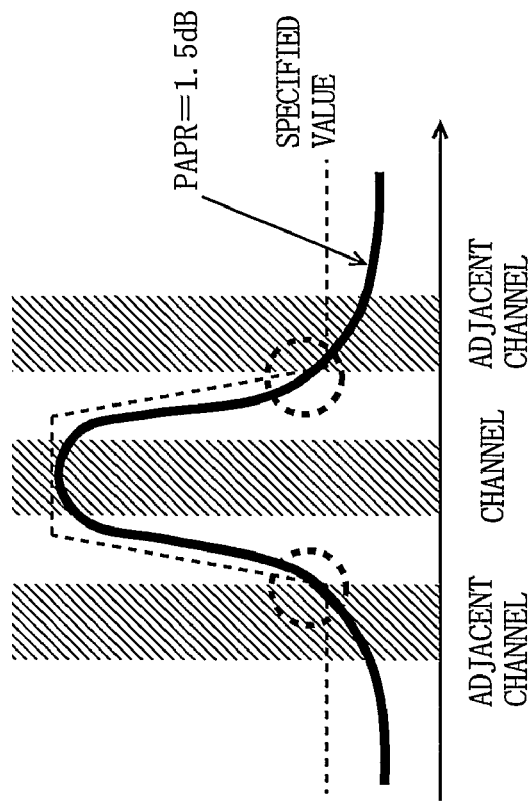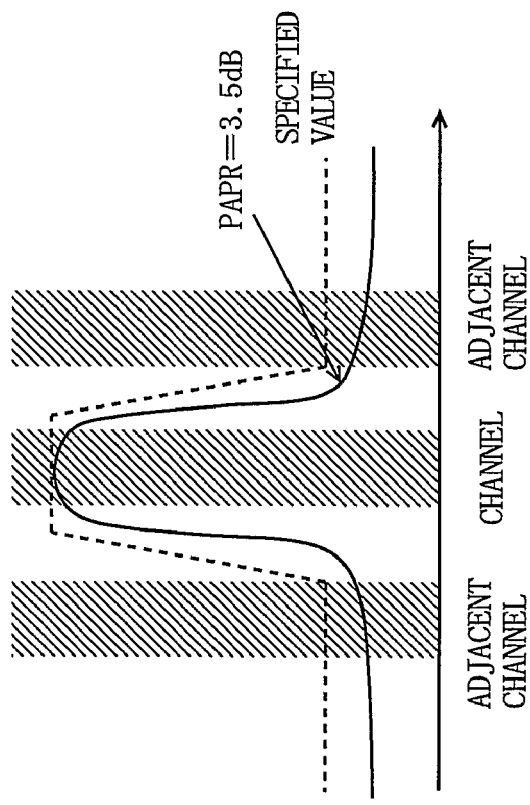

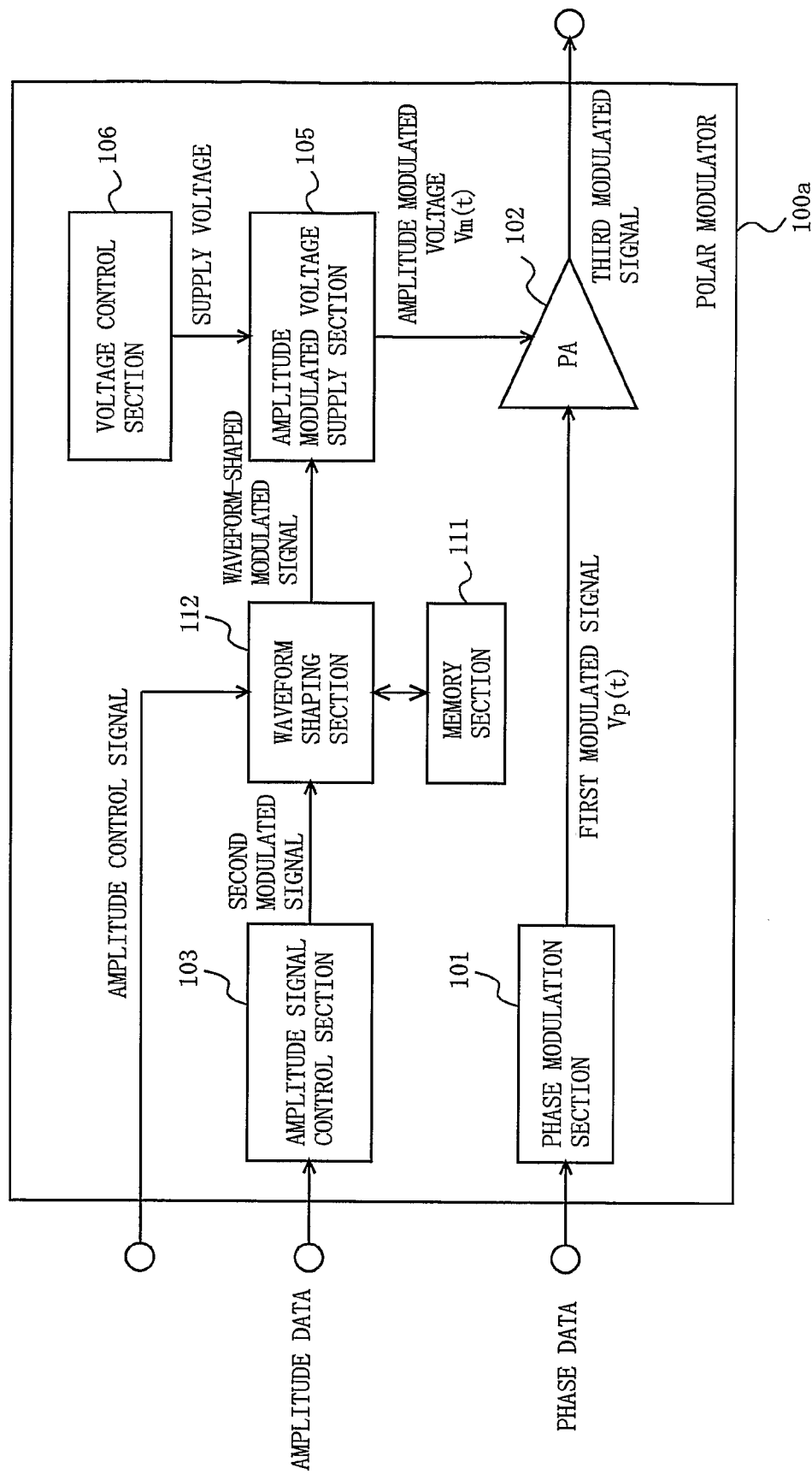
F I G. 8

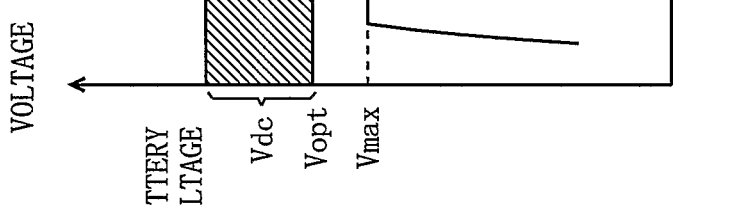
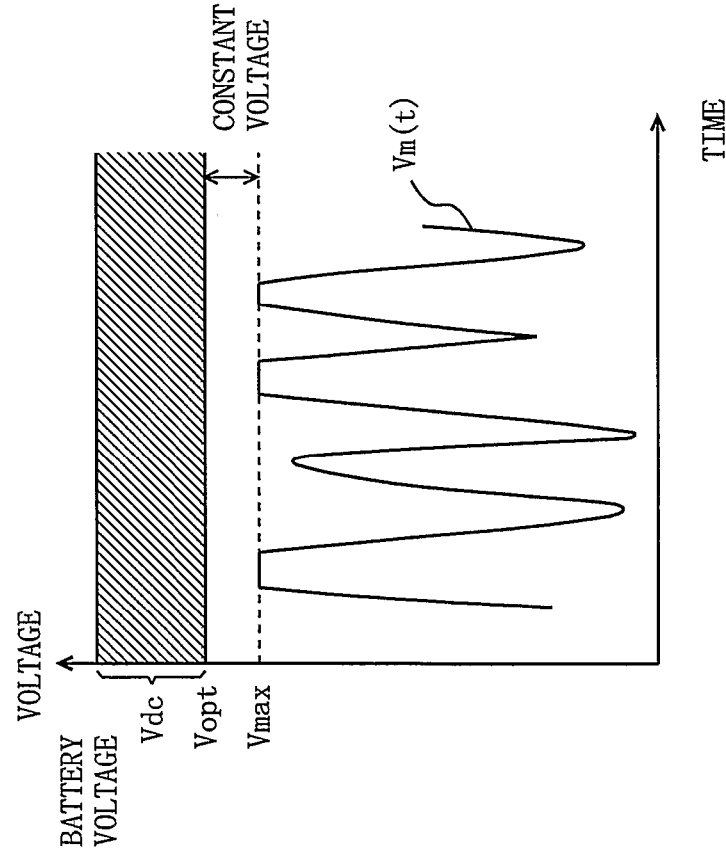

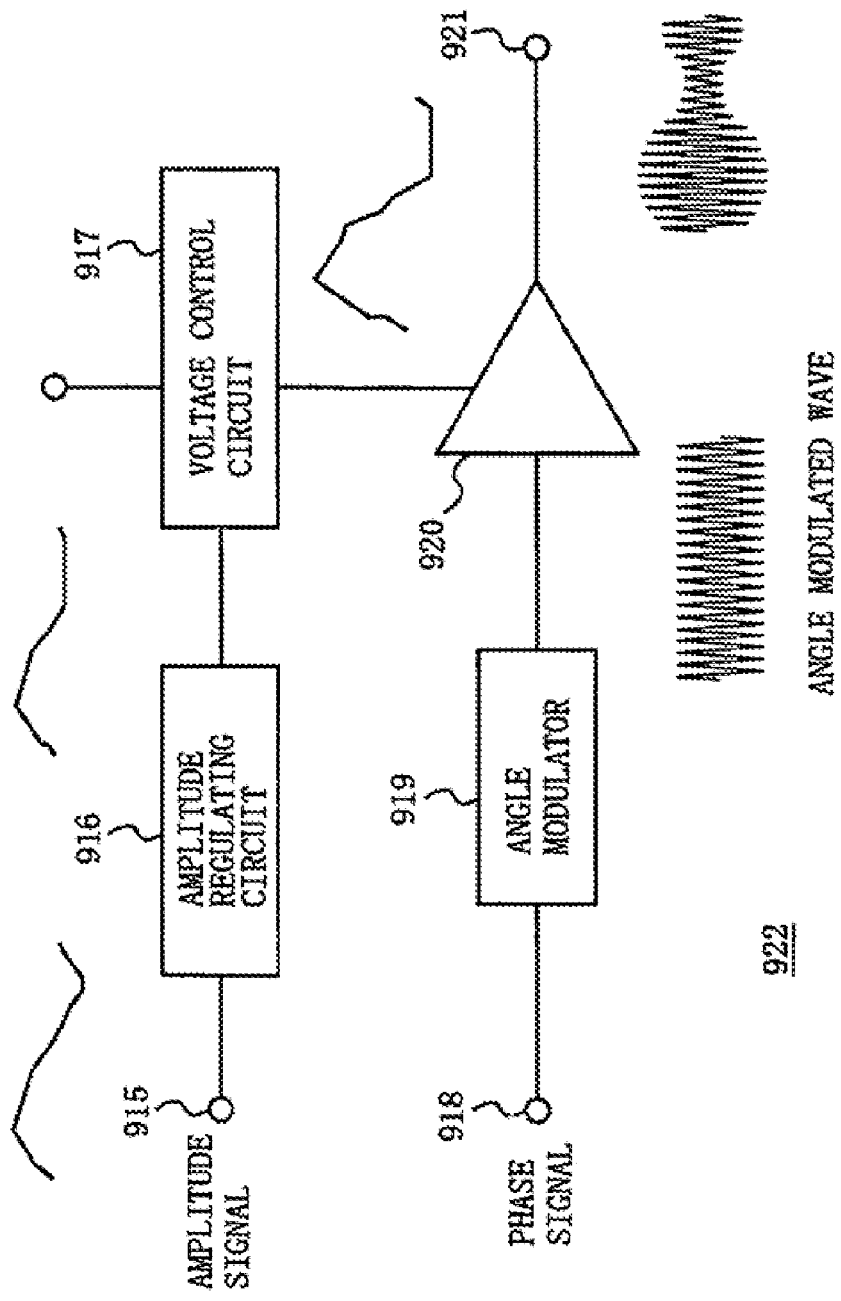

US 7,634,022 B2

POLAR MODULATOR AND WIRELESS COMMUNICATION APPARATUS USING THE SAME

TECHNICAL FIELD

The present invention relates to a modulation device, and more particularly to a polar modulator and a wireless communication apparatus using the same.

BACKGROUND ART

Cellular phones are desired to be usable for a long period of time with a limited amount of battery capacity. A power amplification section for amplifying a high frequency signal and supplying transmission power to an antenna especially consumes a large amount of power. Therefore, it is important to improve the efficiency of the power amplification section.

Various communication systems have become widely used in the world, and a multi-mode wireless communication terminal which is usable with a plurality of communication systems is desired. However, a multi-mode wireless communication terminal produced based on the conventional technology inevitably includes a larger number of components, especially in the wireless section, and is increased in size and cost. In order to realize a multi-mode wireless communication terminal, it is an important object to commonly use components for a plurality of communication systems.

The EDGE (Enhanced Data GSM Environment) system has been developed for increasing the communication speed based on the GSM (Global System for Mobile Communications), which is one cellular phone standard. With the EDGE system, a polar modulation (polar modulation) system is often adopted as a modulation system in a wireless transmission section. The polar system is highly compatible with the transmission circuit configuration of the GMSK (Gauss filtered Minimum Shift Keying) modulation, which is a conventional modulation system.

With a multi-mode wireless communication terminal compatible with the GSM system and the UMTS (Universal Mobile Telecommunications System), adoption of the polar system results in a uniform platform and thus simplification of the system.

In order to restrict the size enlargement of the wireless section, it is effective to, for example, commonly use components such as a power amplifier and the like for a plurality of communication systems. However, such a step generally reduces the operation efficiency. In addition, the UMTS requires the power to be controlled over a range from a very low output to a high output. Therefore, it is also important to securely obtain a transmission dynamic range.

With the above-described background, the following technologies have been proposed.

Means for controlling a power supply section for polar modulation operation of the power amplification section is disclosed in the specification of U.S. Pat. No. 6,528,975 (hereinafter, referred to as "patent document 1") FIG. 20 is a block diagram showing a structure of an amplitude control section 900 in a polar modulator described in patent document 1.

As shown in FIG. 20, the amplitude control section 900 includes an input terminal 901, a DAC (digital-analog converter) 902, a controller 903, a comparator 904, an OP amplifier 905, a current monitor 906, a power supply terminal 907, a load 908, a transistor 909, and a power supply terminal 910.

Amplitude data which is input from the input terminal 901 is input to the OP amplifier 905 via the DAC 902. The output voltage of the OP amplifier 905 is input to a base of the transistor 909 via the current monitor 906. Thus, the transistor 909 amplifies the signal which is input to the base based on a supply voltage Vbat which is input from the power supply terminal 910, and outputs the amplified signal as a modulated signal voltage Vm(t). The load 908 is a power amplifier. The transistor 909 modulates the power supply terminal 907 of the power amplifier connected thereto as the load 908 using the modulated signal voltage Vm(t). The modulated signal voltage Vm(t) is fed back to the OP amplifier 905. The OP amplifier 905 compares a modulated signal which is output from the DAC 902 and the modulated signal voltage Vm(t) which is fed back, and adjusts the output voltage.

A saturation voltage of 0.1 V is present between an emitter and a collector of the transistor 909. Therefore, the supply voltage Vbat of the transistor 909 needs to be higher by at least 0.1 V than the maximum value of the modulated signal voltage Vm(t). Otherwise, the transistor 909 is saturated and becomes inoperable. When the transistor 909 is saturated, an electric current flows into the base thereof. The current monitor 906 monitors the electric current flowing into the base, and transfers the monitoring result to the comparator 904. The comparator 904 determines whether or not the electric current monitored by the current monitor 906 is equal to or larger than a predetermined threshold value. When the electric current is equal to or larger than the predetermined threshold value, the comparator 904 transfers such information to the control section 903. In accordance with this, the control section 903 reduces the maximum value of the output voltage from the DAC 902 until the comparator 904 stops transferring the information that the current is equal to or larger than the predetermined threshold value via the current monitor 906. By reducing the maximum value of the output voltage from the DAC 902 as described above, the Vbat can be kept higher by at least 0.1 V than the maximum value of the modulated signal voltage Vm(t). Thus, the transistor 909 can be prevented from being saturated.

When the power supply terminal 910 of the transistor 909 is provided with a sufficiently high supply voltage Vbat, the above-described control is not necessary. However, the supply voltage Vbat is usually supplied from a battery. Accordingly, when the capacity of the battery is reduced, the above-described control becomes necessary. Namely, when the amplification control section 900 described in patent document 1 is used, a stable operation is realized without the transistor 909 being saturated even if the supply voltage Vbat is lowered due to the reduction in the voltage of the battery.

An example of enlarging the dynamic range in a polar modulator is disclosed in the specification of U.S. Pat. No. 6,242,975 (hereinafter, referred to as "patent document 2"). FIG. 21 is a block diagram showing a structure of a polar modulator 923 described in patent document 2.

As shown in FIG. 21, the polar modulator 923 includes an envelope extractor/regulator 911, a variable amplifier 912, a power amplifier 913, and a quadrature modulator 914. An I (Inphase) baseband signal and a Q (Quadrature) baseband signal are input to the envelope extractor/regulator 911. The envelope extractor/regulator 911 outputs an Ic signal and a Qc signal with which the amplitude component $(I^2+Q^2)^{1/2}$ is constant, and also outputs an amplitude signal indicating an envelope component of the I and Q base band signals. The variable amplifier 912 regulates a component of the amplitude signal larger than a predetermined value to the predetermined value. The quadrature modulator 914 generates a phase modulated signal based on the Ic signal and the Qc signal which are input thereto, and outputs the phase modulated signal to the power amplifier 913. The amplitude signal is adjusted in terms of the amplitude by the variable amplifier 912, and then is input to a power supply section of the power amplifier 913. The power amplifier 913 modulates the amplitude of the phase modulated signal using the amplitude signal, and outputs a modulated signal. The envelope extractor/regulator 911 regulates the amplitude of the amplitude signal. By this operation, a peak to average power ratio (PAPR), which is the ratio of the maximum value with respect to the average value, of the modulated signal is reduced. As a result, the changing width of the amplitude signal is suppressed, and thus the dynamic range is enlarged.

In the case where the dynamic range is enlarged, the range in which the amplifying element used in the power amplification section has linearity is enlarged.

FIG. 22 is a graph illustrating the relationship between the adjacent channel leakage power (ACP) and the PAPR of an amplitude signal in an output from a cellular phone using the IS95 system. In the case where, for example, the transmission frequency is 1980 MHz, the ACP does not increase when the PAPR is equal to or larger than 10 dB. By contrast, when the PAPR is smaller than 4.2 dB, the ACP goes outside −54 dBc which is the specified value. Namely, as long as the PAPR of the amplitude signal is regulated to be equal to or larger than 4.2 dB, the ACP never goes outside the specified value. Therefore, the envelope extractor/regulator 911 regulates the amplitude of the amplitude signal so as not to go outside the specified value. In this way, an average output which is larger by 6 dB at the maximum is obtained than the case where the PAPR is not regulated as described above. As a result, the dynamic range is enlarged.

Another example of enlarging the dynamic range in a polar modulator is disclosed in the specification of the United States Laid-Open Patent Publication No. 2005/0008093 (hereinafter, referred to as "patent document 3"). FIG. 23 is a block diagram showing a structure of a polar modulator 922 described in patent document 3.

As shown in FIG. 23, the polar modulator 922 includes an amplitude signal input terminal 915, an amplitude regulation circuit 916, a voltage control circuit 917, a phase signal input terminal 918, an angle modulator 919, a power amplifier 920, and an output terminal 921.

The angle modulator 919 modulates the angle of a phase signal which is input thereto. When the amplitude of an input amplitude signal becomes smaller than a first value, the amplitude regulation circuit 916 and the voltage control circuit 917 shape the waveform of the amplitude signal, such that the amplitude of a portion of the amplitude signal which is smaller than the first value is increased to the first value. When the amplitude of the input amplitude signal becomes larger than a second value, which is larger than the first value, the amplitude regulation circuit 916 and the voltage control circuit 917 shape the waveform of the amplitude signal, such that the amplitude of a portion of the amplitude signal which is larger than the second value is decreased to the second value. The power amplifier 920 modulates the amplitude of the angle modulated wave which is output from the angle modulator 919 using a signal which is output from the voltage control circuit 917, and thus outputs an amplitude modulated voltage. By this operation, the maximum value of the amplitude signal which is input to the power amplifier 920 can be regulated. As a result, even if the amplifying element used in the power amplifier 920 does not have linearity in a wide range, a desirable signal having little distortion can be obtained. Thus, the dynamic range is enlarged. By contrast, when the structure shown in patent document 3 is adopted, a power amplifier having a smaller range of linearity but consuming a smaller amount of power can be used. In this case, the efficiency can be improved.

The technology described in patent document 1 has the following problem. With the structure described in patent document 1, when the supply voltage Vbat is lowered, the amplitude control section 900 operates with the maximum possible amplitude modulated voltage Vm(t) at which the transistor 909 is not saturated. Accordingly, when the supply voltage Vbat is lowered, a high operation efficiency is realized. However, when the supply voltage Vbat is apparently higher by at least 0.1 V than the maximum value of the amplitude modulated voltage Vm(t), for example, immediately after the battery is charged, the power using efficiency is reduced. As wireless communication is increased in speed and capacity, transmission circuits are desired to operate more and more efficiently. In a structure in which an amplitude signal is input from a series regulator provided with a fixed value of supply voltage to the power amplifier so as to perform polar modulation, it is most important to suppress the loss in the series regulator in order to realize a highly efficient operation. However, in the amplitude control section 900 of patent document 1, the efficiency is lowered when the supply voltage Vbat is high, which is not preferable.

The structures described in patent documents 2 and 3 can enlarge the dynamic range and increase the efficiency, but have the following problems. The technologies of patent documents 2 and 3 increase the efficiency by reducing the size of the power amplifier. However, when, for example, one polar modulator is commonly used for the GSM system and the UMTS, the size of the power amplifier cannot be reduced. The reason is that it is determined by the standards that the maximum output of the operation by the EDGE system or the UMTS is smaller than the maximum output of the operation by the GMSK system, and thus the size of the power amplifier is determined by the maximum output of the GMSK modulation operation.

The specified value of the ACP varies in accordance with the modulation system used. The technologies described in patent documents 2 and 3 control the PAPR and thus enlarge the dynamic range by controlling the amplitude of the amplitude signal to be uniform. However, when a plurality of modulation systems are usable, such uniformization of the amplitude of the amplitude signal may result in the dynamic range being not securely obtained. By contrast, when a regulated value of the amplitude signal is increased in order to securely obtain the dynamic range, the efficiency may be reduced or the signal may be distorted.

As described above, the conventional technologies are not sufficient in increasing the power utilization efficiency and/or enlarging the dynamic range. Especially when a plurality of modulation systems are usable, for example, in a multi-mode operation, it is difficult to increase the power utilization efficiency and/or to enlarge the dynamic range with the conventional technologies.

Accordingly, an object of the present invention is to provide a polar modulator which can increase the power utilization efficiency and/or enlarge the dynamic range, and a wireless communication apparatus using the same.

DISCLOSURE OF THE INVENTION

The present invention is directed to a polar modulator. In order to achieve the above-described object, a polar modulator according to a first aspect of the present invention comprises a power amplification section; a phase modulation section for generating a first modulated signal including phase information; an amplitude signal control section for generating a second modulated signal including amplitude information; a waveform shaping section for, when an amplitude of the second modulated signal is larger than a predetermined regulated value, generating a waveform-shaped modulated signal obtained as a result of shaping a waveform of the second modulated signal, such that the amplitude of a portion of the second modulated signal which exceeds the predetermined regulated value becomes equal to or smaller than the predetermined regulated value; a voltage control section for outputting a supply voltage; and an amplitude modulated voltage supply section for amplifying the waveform-shaped modulated signal using a transistor based on the supply voltage which is output from the voltage control section and for supplying the amplified signal to the power amplification section as an amplitude modulated voltage. The power amplification section amplifies the first modulated signal based on the amplitude modulated voltage, and thus outputs a third modulated signal obtained as a result of modulating an amplitude of the first modulated signal; and the waveform shaping section adjusts the predetermined regulated value in accordance with a factor for changing a distorted power generated by the power amplification section, such that an ACP generated in the power amplification section becomes equal to or smaller than a first predetermined value, or such that a power at a receiving band becomes equal to or smaller than a second predetermined value.

In the case where a power value of the first modulated signal is a factor for changing the distorted power generated by the power amplification section, the waveform shaping section may adjust the predetermined regulated value in accordance with the power value of the first modulated signal. In the case where an amplitude value of the second modulated signal is a factor for changing the distorted power generated by the power amplification section, the waveform shaping section may adjust the predetermined regulated value in accordance with the amplitude value of the second modulated signal.

In the case where a combination of a gain shown in a control channel and a gain shown in a data channel is a factor for changing a peak to average power ratio (PAPR), the waveform shaping section changes the number of the sub carriers to be used or a modulation system to be used. In the case where a number of sub carriers to be used is a factor for changing a peak to average power ratio (PAPR), the waveform shaping section may adjust the predetermined regulated value in accordance with a modulation rule of the sub carriers to be used. In the case where the polar modulator is capable of outputting a signal using any of a plurality of modulation systems and a modulation system to be used is a factor for changing a peak to average power ratio (PAPR), the waveform shaping section may adjust the predetermined regulated value in accordance with the modulation system to be used.

Preferably, the polar modulator further comprises a memory section for storing the predetermined regulated value which is set by the waveform shaping section; and the waveform shaping section reads the predetermined regulated value from the memory section and thus adjusts the predetermined regulated value. It is preferable that the memory section has step-by-step regulated values stored therein in correspondence with a plurality of different output powers from the power amplification section.

The voltage control section may include a plurality of DC power supplies capable of outputting a plurality of different supply voltages from one another; the amplitude modulated voltage supply section may include a plurality of series regulators respectively provided in correspondence with the plurality of DC power supplies, each of the plurality of series regulators being for amplifying the waveform-shaped modulated signal using the transistor based on the corresponding supply voltage and for supplying the amplified signal to the power amplification section as the amplitude modulated voltage; and the polar modulator may further comprise a switch section for inputting the waveform-shaped modulated signal generated by the waveform shaping section to any one of the plurality of series regulators.

In the case where the polar modulator is capable of outputting a signal using any of a plurality of modulation systems and the modulation system to be used is a factor for changing the distorted power generated by the power amplification section, the waveform shaping section may adjust the predetermined regulated value in-accordance with the modulation system to be used, and the switching section may select the series regulator, to which the waveform-shaped modulated signal is to be input, in accordance with the modulation system to be used.

A polar modulator according to a second aspect of the present invention comprises a power amplification section; a phase modulation section for generating a first modulated signal including phase information; an amplitude signal control section for generating a second modulated signal including amplitude information; a voltage control section for outputting a supply voltage; and an amplitude modulated voltage supply section for amplifying the second modulated signal using a transistor based on the supply voltage which is output from the voltage control section and for supplying the amplified signal to the power amplification section as an amplitude modulated voltage. The power amplification section amplifies the first modulated signal based on the amplitude modulated voltage, and thus outputs a third modulated signal obtained as a result of modulating an amplitude of the first modulated signal; and the voltage control section supplies a voltage, obtained based on a maximum value of the amplitude modulated voltage which is output from the transistor, to the amplitude modulated voltage supply section as the supply voltage.

Preferably, the voltage control section is a switching regulator; the switching regulator is provided with a voltage from a battery; and the voltage control section supplies a voltage, which is higher than a voltage obtained as a result of adding the maximum value of the amplitude modulated voltage and a constant voltage determined based on a saturation voltage of the transistor and which is lower than the voltage provided from the battery, to the amplitude modulated voltage supply section as the supply voltage.

The polar modulator may further comprise a voltage measuring section for detecting the maximum value of the amplitude modulated voltage which is output from the amplitude modulated voltage supply section; and the voltage control section may supply the supply voltage, obtained based on the maximum value of the amplitude modulated voltage detected by the voltage measuring section, to the amplitude modulated voltage supply section.

The voltage control section may obtain the maximum value of the amplitude modulated voltage based on the amplitude information, and supply a voltage, obtained based on the obtained maximum value, to the amplitude modulated voltage supply section as the supply voltage. The voltage control section may supply a voltage, obtained as a result of adding the maximum value of the amplitude modulated voltage and a constant voltage determined based on the saturation voltage of the transistor, to the amplitude modulated voltage supply section as the supply voltage.

The polar modulator may further comprise a waveform shaping section for, when an amplitude of the second modulated signal is larger than a predetermined regulated value, generating a waveform-shaped modulated signal obtained as a result of shaping a waveform of the second modulated signal, such that the amplitude of a portion of the second modulated signal which exceeds the predetermined regulated value becomes equal to or smaller than the predetermined regulated value; and the amplitude modulated voltage supply section may amplify the waveform-shaped modulated signal, instead of the second modulated signal, using the transistor, and supply the amplified signal to the power amplification section as the amplitude modulated voltage.

It is preferable that the voltage control section supplies a voltage, obtained as a result of adding the predetermined regulated value and a constant voltage determined based on the saturation voltage of the transistor, to the amplitude modulated voltage supply section as the supply voltage. It is preferable that the waveform shaping section adjusts the predetermined regulated value in accordance with a factor for changing a distorted power generated by the power amplification section, such that an ACP generated in the power amplification section becomes equal to or smaller than a first predetermined value, or such that a power at a receiving band becomes equal to or smaller than a second predetermined value.

The voltage control section may include a plurality of DC power supplies capable of outputting a plurality of different supply voltages from one another; the amplitude modulated voltage supply section may include a plurality of series regulators respectively provided in correspondence with the plurality of DC power supplies, each of the plurality of series regulators being for amplifying the second modulated signal using the transistor based on the corresponding supply voltage and for supplying the amplified signal to the power amplification section as the amplitude modulated voltage; the polar modulator may further comprise a switch section for inputting the second modulated signal to any one of the plurality of series regulators; and the voltage control section may select the DC power supply to be used based on the maximum value of the amplitude modulated voltage which is output from the transistor included in the series regulator to be used, and supply a voltage, which is output from the DC power supply to be used, to the amplitude modulated voltage supply section as the supply voltage. In this case, the polar modulator is capable of outputting a signal using any of a plurality of modulation systems; and the switch section preferably selects the series regulator, to which the second modulated signal is to be input, in accordance with the modulation system to be used.

A polar modulator according to a third aspect of the present invention comprises a power amplification section; a phase modulation section for generating a first modulated signal including phase information; an amplitude signal control section for generating a second modulated signal including amplitude information; a voltage control section for outputting a supply voltage; and an amplitude modulated voltage supply section for amplifying the second modulated signal using a transistor based on the supply voltage which is output from the voltage control section and for supplying the amplified signal to the power amplification section as an amplitude modulated voltage. The power amplification section amplifies the first modulated signal based on the amplitude modulated voltage, and thus outputs a third modulated signal obtained as a result of modulating an amplitude of the first modulated signal; and the voltage control section supplies the supply voltage, at which the transistor is operated in a constant current region, to the amplitude modulated voltage supply section.

Typically, when the transistor is a bipolar transistor, the constant current region is a non-saturation region; and when the transistor is a MOS transistor, the constant current region is a saturation region.

The polar modulator may further comprise a waveform shaping section for, when an amplitude of the second modulated signal is larger than a predetermined regulated value, generating a waveform-shaped modulated signal obtained as a result of shaping a waveform of the second modulated signal, such that the amplitude of a portion of the second modulated signal which exceeds the predetermined regulated value becomes equal to or smaller than the predetermined regulated value; and the amplitude modulated voltage supply section may amplify the waveform-shaped modulated signal, instead of the second modulated signal, using the transistor, and supply the amplified signal to the power amplification section as the amplitude modulated voltage.

It is preferable that the voltage control section supplies a voltage, obtained as a result of adding the predetermined regulated value and a constant voltage obtained based on a saturation voltage of the transistor, to the amplitude modulated voltage supply section as the supply voltage. It is preferable that the waveform shaping section adjusts the predetermined regulated value in accordance with a factor for changing a distorted power generated by the power amplification section, such that an ACP generated in the power amplification section becomes equal to or smaller than a first predetermined value, or such that a power at a receiving band becomes equal to or smaller than a second predetermined value.

The voltage control section may include a plurality of DC power supplies capable of outputting a plurality of different supply voltages from one another; the amplitude modulated voltage supply section may include a plurality of series regulators respectively provided in correspondence with the plurality of DC power supplies, each of the plurality of series regulators being for amplifying the second modulated signal using the transistor based on the corresponding supply voltage and for supplying the amplified signal to the power amplification section as the amplitude modulated voltage; the polar modulator may further comprise a switch section for inputting the second modulated signal to any one of the plurality of series regulators; and the voltage control section may select the DC power supply to be used based on the maximum value of the amplitude modulated voltage which is output from the transistor included in the series regulator to be used, and supply a voltage, which is output from the DC power supply to be used, to the amplitude modulated voltage supply section as the supply voltage.

In the case where the polar modulator is capable of outputting a signal using any of a plurality of modulation systems, the switch section may select the series regulator, to which the second modulated signal is to be input, in accordance with the modulation system to be used.

The present invention is also directed to a wireless communication apparatus using a battery as a power supply. In order to achieve the above-described object, a wireless communication apparatus according to the present invention comprises a baseband section for generating and processing a baseband signal; a transmission section for converting the baseband signal generated by the baseband section into a transmission signal; an antenna section for receiving a receiving signal; a receiving section for converting the receiving signal into a baseband signal and inputting the baseband signal to the baseband section; and a common section for transferring the transmission signal to the antenna section and transferring the receiving signal to the receiving section. The transmission section includes a polar modulator according to any of the first through third aspects for converting the baseband signal into the transmission signal.

According to a polar modulator of the present invention described above, the ACP included in the third modulated signal which is output from the power amplification section can be equal to or smaller than a predetermined value. Namely, the polar modulator can obtain a third modulated signal with the distortion component thereof suppressed by limiting the peak value of the second modulated signal, even if the amplifying element used in the power amplification section does not have linearity in a wide range. In addition, the polar modulator according to the present invention can prevent an unnecessary voltage from being supplied to the amplitude modulated voltage supply section and thus can improve the power utilization efficiency. The polar modulator according to the present invention can also prevent the transistor of each series regulator from being saturated. As a result, an accurate amplitude modulated voltage can be supplied to the power amplification section, and accurate modulation is made possible. A wireless communication apparatus, by using the polar modulator according to the present invention in a transmission section thereof, can be reduced in size and cost.

As described above, the present invention provides a polar modulator for improving the power utilization efficiency and/or enlarging the dynamic range, and a wireless communication apparatus using the same.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3A shows a waveform of a third modulated signal which is output from a power amplification section 102 when a waveform shaping section 104 does not perform peak limiting.

FIG. 3B shows a waveform of the third modulated signal which is output from the power amplification section 102 when the waveform shaping section 104 performs peak limiting.

FIG. 4A shows a power spectrum illustrating the relationship between the PAPR and the specified value when the waveform shaping section 104 does not perform peak limiting.

FIG. 4B shows a power spectrum illustrating the relationship between the PAPR and the specified value when the waveform shaping section 104 performs peak limiting.

FIG. 8 is a block diagram showing a functional structure of a polar modulator 100a in the case where a predetermined peak limit value is stored in a memory section 111.

FIG. 15A illustrates the control performed by a voltage control section 306b.

FIG. 15B illustrates the control performed by the voltage control section 306b.

FIG. 20 is a block diagram showing a structure of an amplitude control section 900 of a polar modulator described in patent document 1.

FIG. 23 is a block diagram showing a structure of a polar modulator 922 described in patent document 3.

BEST MODE FOR CARRYING OUT THE INVENTION

Hereinafter, the present invention will be described by way of embodiments with reference to the drawings.

First Embodiment

Figure 1:
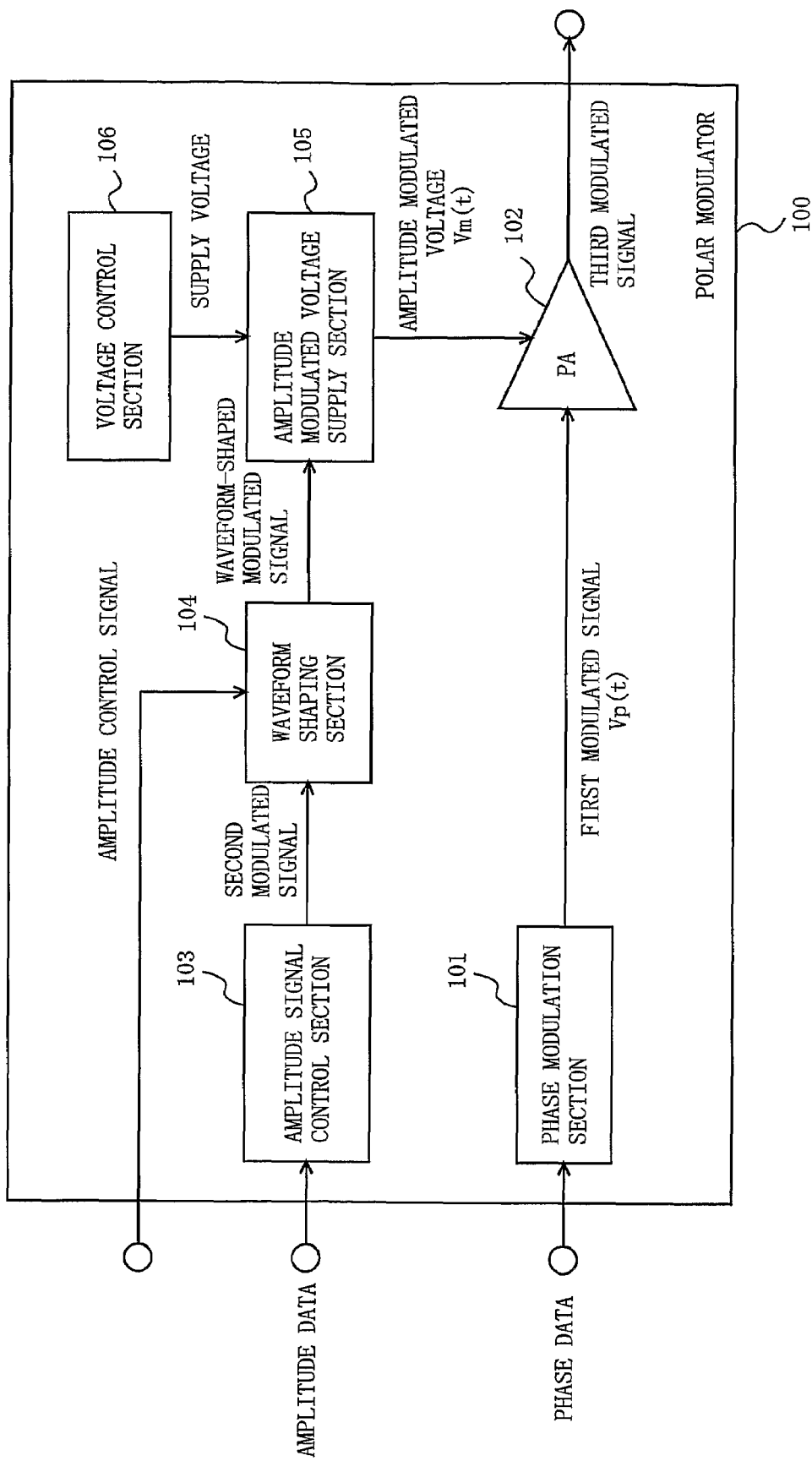
FIG. 1 is a block diagram showing a functional structure of a polar modulator 100 according to a first embodiment of the present invention.

FIG. 1 is a block diagram showing a functional structure of a polar modulator 100 according to a first embodiment of the present invention. As shown in FIG. 1, the polar modulator 100 includes a phase modulation section 101, a power amplification section 102, an amplitude signal control section 103, a waveform shaping section 104, an amplitude modulated voltage supply section 105, and a voltage control section 106.

A baseband section (not shown in FIG. 1) decomposes a baseband signal into amplitude data (I) and phase data (Q). When, for example, a QPSK (Quadrature-Phase Shift Keying) signal is used as a baseband signal, the baseband section decomposes the QPSK signal into amplitude data and phase data. The amplitude data is input to the amplitude signal control section 103. The phase data is input to the phase modulation section 101.

The phase modulation section 101 generates a first modulated signal Vp(t) including phase information based on the phase data, and outputs the first modulated signal Vp(t) to the power amplification section 102. The first modulated signal Vp(t) is a phase modulated signal having a constant envelope.

The amplitude signal control section 103 generates a second modulated signal including amplitude information based on the amplitude data, and outputs the second modulated signal to the waveform shaping section 104. The second modulated signal represents an envelope component of the baseband signal.

The waveform shaping section 104 has a function of limiting the second modulated signal. A limit value which is set by the waveform shaping section 104 will be referred to as a "peak limit value". A peak limit value is generally defined by an index of PAPR, and is adjusted as necessary in accordance with the condition of use. When the amplitude of the second modulated signal which is output from the amplitude signal control section 103 is larger than a predetermined peak limit value, the waveform shaping section 104 shapes the waveform of the second modulated signal such that the amplitude of a portion of the second modulated signal which exceeds the predetermined peak limit value becomes equal to or smaller than the predetermined peak limit value, and outputs the resultant signal as a waveform-shaped modulated signal.

The waveform shaping section 104 receives an amplitude control signal. The amplitude control signal includes information, which is a factor for changing a distorted power (a power arisen from a distortion) generated by the power amplification section 102. Factors for changing the distorted power are, for example, a change in the power value of the first modulated signal and a change in the amplitude value of the second modulated signal. A factor for changing a PAPR also changes the distorted power. Factors for changing a PAPR are, for example, a combination of a gain shown in a control channel (described in detail later) and a gain shown in a data channel (described in detail later), a number of sub carriers to be used in a multi-carrier modulation system, and a modulation system (type of signal) to be used. The distorted power generated by the power amplification section 102 is changed by a variety of factors as described above, but all the factors are information obtainable in a wireless communication apparatus in which the polar modulator 100 is built. Such information which changes the distorted power is included in the amplitude control signal. The amplitude control signal is input to the waveform shaping section 104 from the baseband section (not shown in FIG. 1).

The waveform shaping section 104 adjusts the predetermined peak limit value which is set therein, in accordance with amplitude control information which is input thereto. Namely, the waveform shaping section 104 adjusts the predetermined peak limit value in accordance with a factor for changing the distorted power generated by the power amplification section 102. It is not that the predetermined peak limit value may be any value. When the peak of the second modulated signal is decreased by an excessively large amount, an excessive amount of distortion component (ACP) is generated in the power amplification section 102 and the amount of the distortion component may go outside the specified value. Accordingly, the waveform shaping section 104 adjusts the peak limit value which is set therein such that the ACP generated in the power amplification section 102 becomes equal to or smaller than the specified value (first predetermined value). The specific examples of adjusting the peak limit value will be described later.

The power control section 106 outputs a supply voltage to the amplitude modulated voltage supply section 105. The power control section 106 is typically provided with a DC power supply from a battery not shown in FIG. 1, but the present invention does not necessarily require a battery. Preferably, the power control section 106 is a switching regulator. Where the power control section 106 is a switching regulator, the DC voltage supplied from the battery can be converted into a supply voltage at a high efficiency, and thus the entire polar modulator 100 can be operated at a high efficiency.

The amplitude modulated voltage supply section 105 includes a transistor for driving the power amplification section 102. The amplitude modulated voltage supply section 105 amplifies the waveform-shaped modulated signal which is input from the waveform shaping section 104 using the transistor based on the supply voltage which is input from the voltage control section 106, and supplies the amplified signal to the power amplification section 102 as an amplitude modulated voltage Vm(t).

Figure 2:
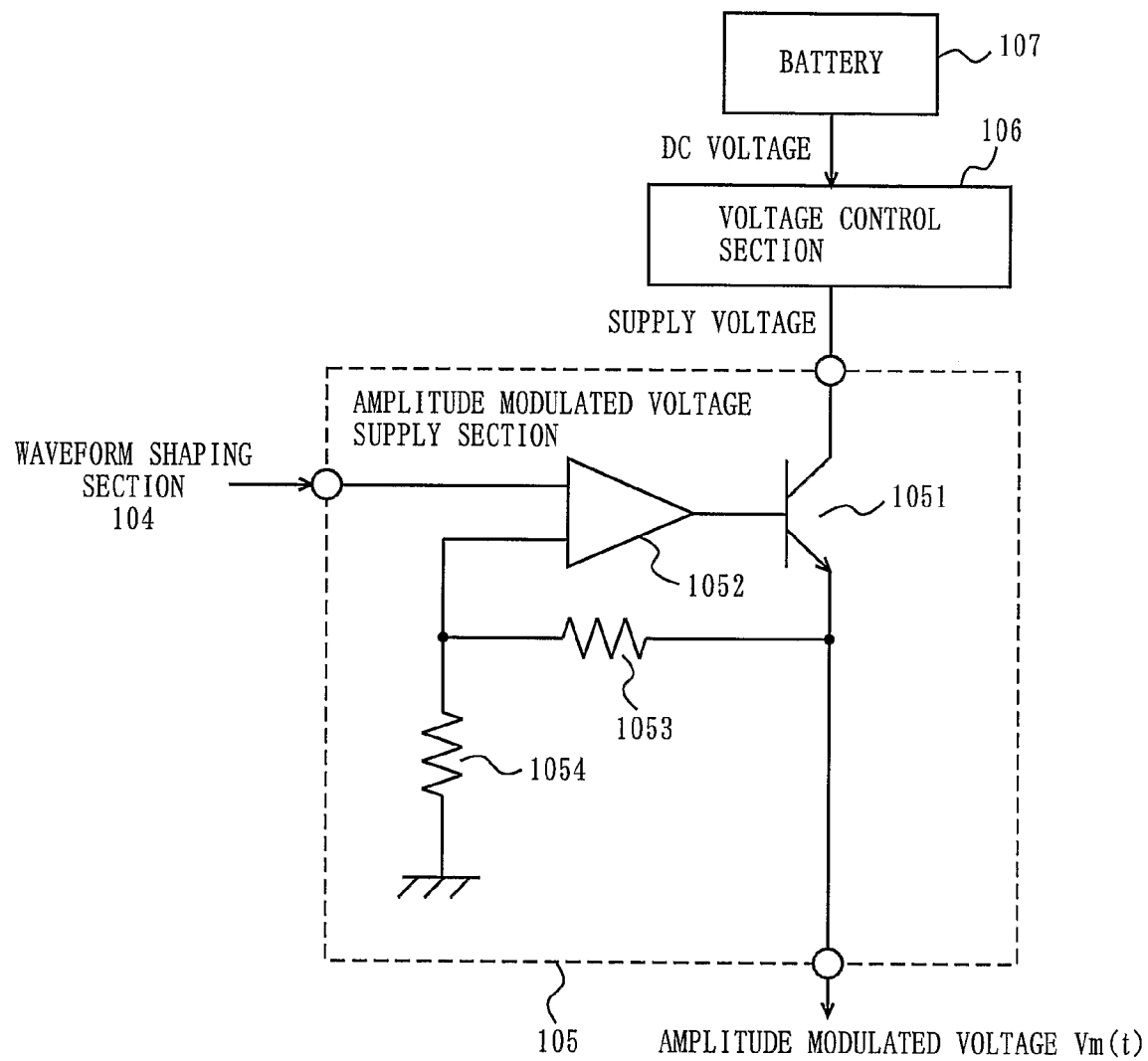
FIG. 2 shows a circuit configuration of an amplitude modulated voltage supply section 105 and connections of elements in the vicinity thereof.

FIG. 2 shows a circuit configuration of the amplitude modulated voltage supply section 105 and connections of elements in the vicinity thereof. As shown in FIG. 2, the voltage control section 106 is provided with a DC voltage from a battery 107. The amplitude modulated voltage supply section 105 is provided with a supply voltage from the voltage control section 106. The amplitude modulated voltage supply section 105 includes a transistor 1051, an OP amplifier 1052, and resistors 1053 and 1054. A base of the transistor 1051 is connected to an output of the OP amplifier 1052. A collector of the transistor 1051 is connected to the supply voltage from the voltage control section 106. The resistor 1053 is connected between an emitter of the transistor 1051 and one input of the OP amplifier 1052. The one input of the OP amplifier 1052 is grounded via the resistor 1054. To the other input of the OP amplifier 1052, the waveform-shaped modulated signal is input from the waveform shaping section 104. The amplitude modulated voltage supply section 105 may have any other structure than that of a series regulator as long as the waveform-shaped modulated signal is amplified. The transistor used in the amplitude modulated voltage supply section 105 is not limited to a bipolar transistor, and may be a MOS transistor. The waveform-shaped modulated signal amplified by the transistor 1051 is supplied to the power amplification section 102 as the amplitude modulated voltage Vm(t).

The power amplification section 102 amplifies the first modulated signal Vp(t) which is input from the phase modulation section 101 based on the amplitude modulated voltage Vm(t) which is input from the amplitude modulated voltage supply section 105 (i.e., mixes the first modulated signal Vp(t) and the amplitude modulated voltage Vm(t)), and thus outputs a third modulated signal obtained as a result of modulating the amplitude of the first modulated signal Vp(t).

FIG. 3A shows a waveform of the third modulated signal which is output from the power amplification section 102 when the waveform shaping section 104 does not perform peak limiting. FIG. 3B shows a waveform of the third modulated signal which is output from the power amplification section 102 when the waveform shaping section 104 performs peak limiting. As shown in FIG. 3A, when the peak limiting is not performed, the maximal value of the third modulated signal changes with the time. Accordingly, when the maximal value of the voltage is in a range of not having linearity in the power amplification section 102, the power amplification section 102 can suppress the distortion component. When the maximal value of the voltage is in a range of having linearity in the power amplification section 102, it is not absolutely necessary to perform peak limiting.

As shown in FIG. 3B, by contrast, when the amplitude of the second modulated signal is regulated to a predetermined peak limit value at which no distortion component is generated in the power amplification section 102, the maximum value of the third modulated signal is necessarily in a range of having linearity in the power amplification section 102. Therefore, the maximum value of the voltage is never in a range of not having linearity in the power amplification section 102. As a result, the dynamic range is enlarged.

The amount of the distorted power generated in the power amplification section 102 is changed by a variety of factors. In this specification, such factors are referred to as "factors for changing the distorted power". By specifying a factor for changing the distorted power, the first embodiment of the present invention can be more easily carried out.

A first factor for changing the distorted power is the power value of the first modulated signal. For example, the power value of the first modulated signal may be changed in order to change the output power of the power amplification section 102. When the power value of the first modulated signal is increased, the distorted power is more easily generated in the power amplification section 102. In the case where a factor generating the distorted power is deterioration in the linearity in the power amplification section 102, the waveform shaping section 104 reduces the predetermined peak limit which is set therein. By this operation, the distorted power generated in the power amplification section 102 can be suppressed. The waveform shaping section 104 preferably adjusts the predetermined peak limit in accordance with the power value of the first modulated signal in this manner. The waveform shaping section 104 may obtain the power value of the first modulated signal by detecting the first modulated signal generated by the phase modulation section 101 or based on the phase information which is input from the baseband section (not shown in FIG. 1). In the case where the factor generating the distorted power is not the deterioration in the linearity in the power amplification section 102, it is preferable to set an appropriate PAPR using the first modulated signal such that the distorted power which is output by the power amplification section 102 fulfills the specified value.

A second factor for changing the distorted power is the amplitude value of the second modulated signal. For example, the amplitude value of the second modulated signal may be changed in order to change the output power of the power amplification section 102. When the amplitude value of the second modulated signal is increased, the distorted power is more easily generated in the power amplification section 102. In such a case, the waveform shaping section 104 reduces the predetermined peak limit which is set therein. By this operation, the distorted power generated in the power amplification section 102 can be suppressed. The waveform shaping section 104 preferably adjusts a predetermined upper limit value in accordance with the amplitude value of the second modulated signal in this manner. The waveform shaping section 104 adjusts the predetermined upper limit value based on, for example, the maximum amplitude value of the second modulated signal. The waveform shaping section 104 may obtain the amplitude value of the second modulated signal by detecting the second modulated signal generated by the amplitude signal control section 103 or based on the amplitude information which is input from the baseband section (not shown in FIG. 1). In the case where a factor generating the distorted power is not deterioration in the linearity in the power amplification section 102, it is preferable to set an appropriate PAPR using the second modulated signal such that the distorted power which is output by the power amplification section 102 fulfills the specified value.

A third factor for changing the distorted power is a factor for changing the PAPR. FIG. 4A shows a power spectrum illustrating the relationship between the PAPR and the specified value when the waveform shaping section 104 does not perform peak limiting. In FIG. 4A, the PAPR is 3.5 dB. FIG. 4B shows a power spectrum illustrating the relationship between the PAPR and the specified value when the waveform shaping section 104 performs peak limiting. In FIG. 4B, the PAPR is 1.5 dB.

As shown in FIG. 4A and FIG. 4B, it is understood that the leak from a desired channel to an adjacent channel is increased by performing peak limiting. Namely, when the PAPR is decreased as a result of peak limiting, the ACP is increased. Due to this, the ACP partially goes outside the specified value as represented by the doted circles in FIG. 4B. Such deterioration in the modulation characteristic is caused because the waveform of the amplitude signal is deformed by peak limiting (amplitude limiting). Accordingly, simple reduction of the PAPR is not preferable. In actuality, the deterioration in the modulation characteristic is also caused by the non-linearity of the amplifying element in the power amplification section 102 or the like. Accordingly, the waveform shaping section 104 needs to set a peak limit value such that an appropriate PAPR is obtained in consideration of how much of the deterioration in the modulation characteristic is caused by factors other than peak limiting (amplitude limiting). In the example shown in FIG. 4A and FIG. 4B, the waveform shaping section 104 preferably determines a predetermined peak limit value such that the PAPR is 2.0 dB. Where the PAPR is 2.0 dB, which is slightly larger than 1.5 dB, the ACP can have some margin to the specified value. In consideration of the non-linearity of the power amplification section 102, the PAPR of 2.0 dB is appropriate.

When factor for changing the PAPR is generated, the appropriate peak limit value at which the ACP does not go outside the specified value also changes. Therefore, the waveform shaping section 104 preferably determines the predetermined peak limit value in accordance with the factor for changing the PAPR.

A first factor for changing the PAPR is a change in the modulation system to be used. In the case where a plurality of modulation systems are usable, as with a multi-mode cellular phone, the PAPR changes in accordance with the modulation system. In accordance with the modulation system, the tolerable specified value of the ACP also changes. Accordingly, the waveform shaping section 104 preferably adjusts the predetermined peak limit value in accordance with the modulation system to be used.

Figure 5:
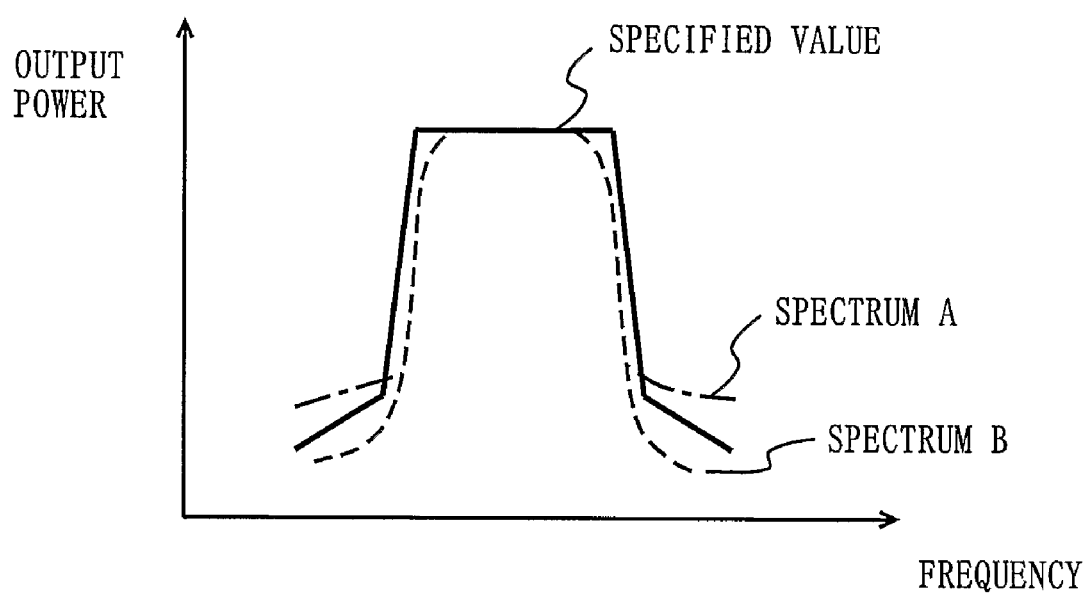
FIG. 5 shows a spectrum of the third modulated signal.

FIG. 5 shows a spectrum of the third modulated signal. In FIG. 5, the specified value is represented with the solid line. Spectrum B of the QPSK signal is within the specified value. By contrast, spectrum A of the QPSK signal is outside the specified value. Unless the peak limit value is appropriate, the ACP may go outside the specified value as represented with spectrum A.

Accordingly, as a prerequisite for adjusting the peak limit value in accordance with the modulation system to be used, the waveform shaping section 104 needs to prepare a peak limit value appropriate to the modulation system to be used. Under the condition that a peak limit value appropriate to the modulation system to be used is prepared, the waveform shaping section 104 adjusts the peak limit value in accordance with the modulation system to be used.

When the power amplification section 102 is driven in a range of not having linearity, the ACP is increased and the power at the receiving band is also increased. Accordingly, even if a peak limit value at which the ACP is kept within the specified value is used, if the power at the receiving band is not within the specified value (second predetermined value), such a peak limit value needs to be re-adjusted based on the power at the receiving band. Namely, the waveform shaping section 104 may adjust the predetermined peak limit value such that the value at the receiving band becomes equal to or smaller than the second predetermined value.

Figure 4C:
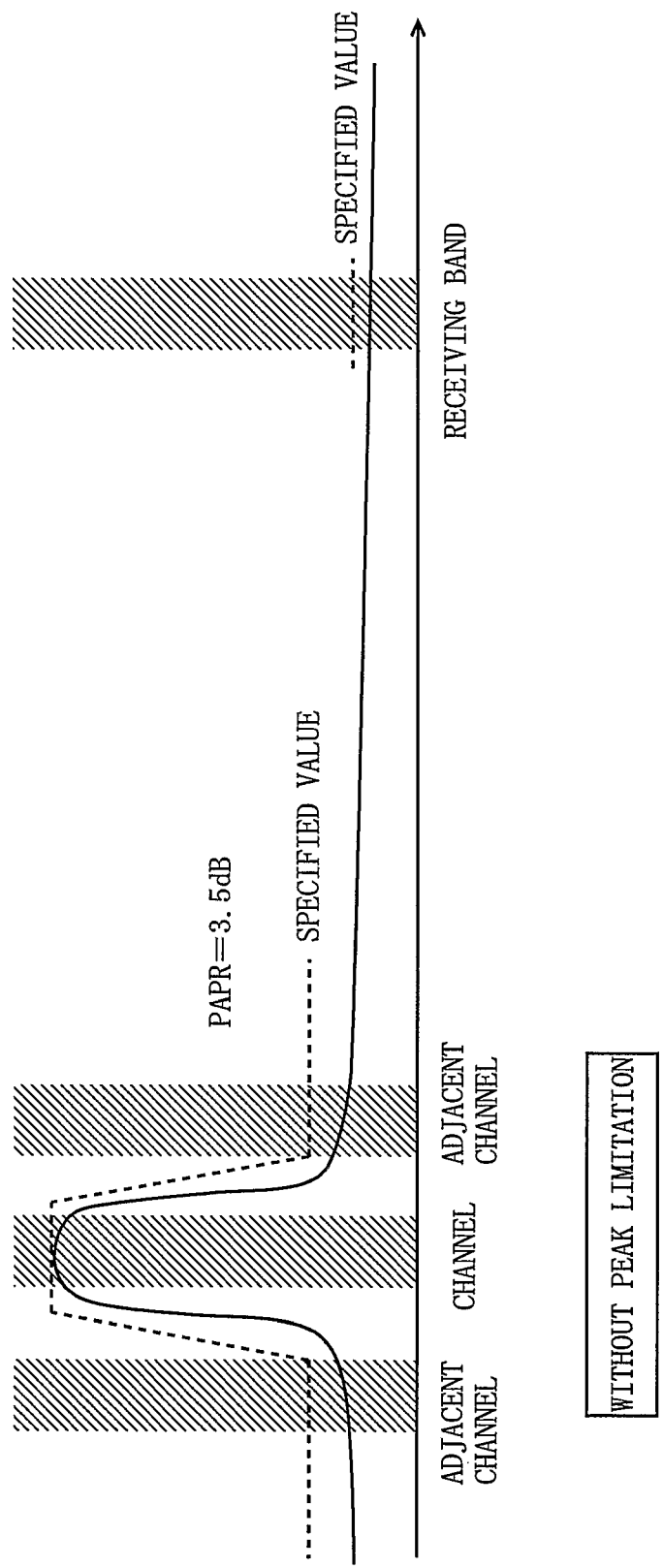
FIG. 4C shows a power spectrum illustrating the relationship between the PAPR and the specified value when the waveform shaping section 104 does not perform peak limiting.
Figure 4D:
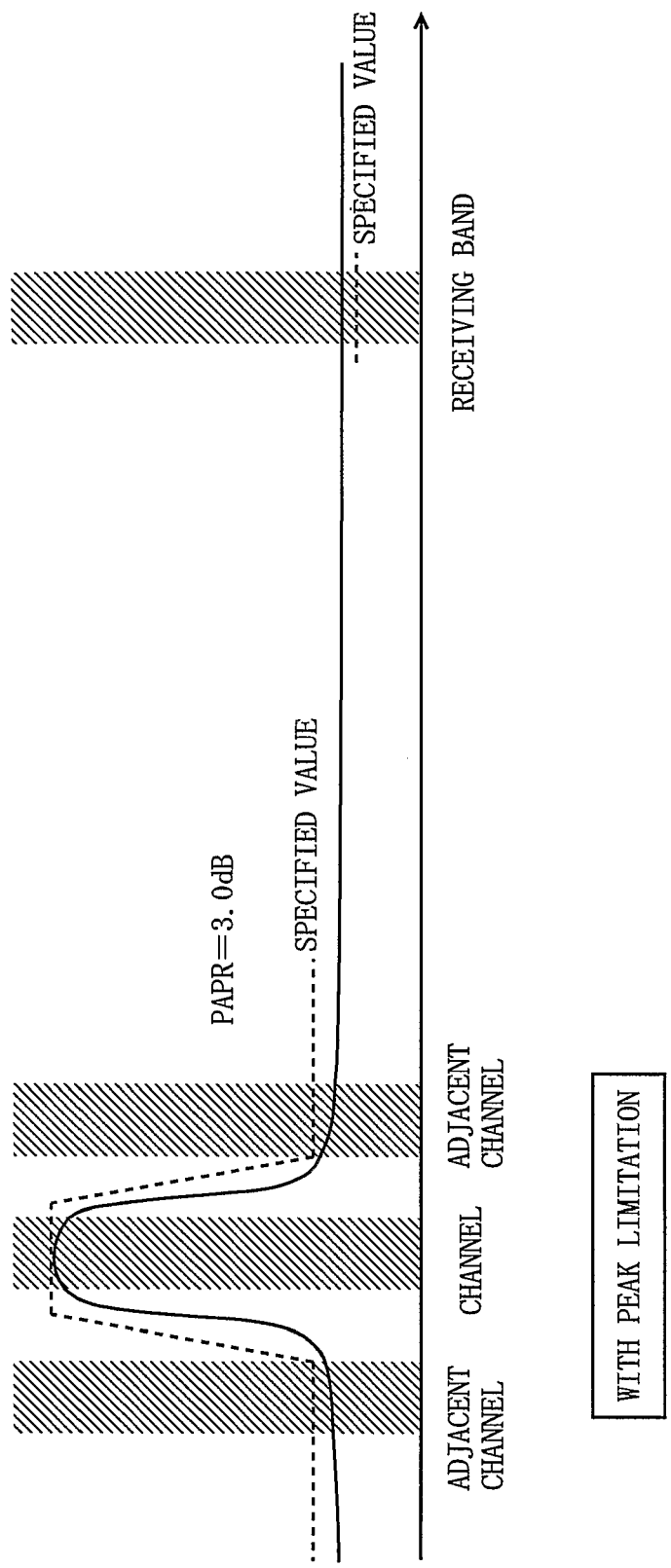
FIG. 4D shows a power spectrum illustrating the relationship between the PAPR and the specified value when the waveform shaping section 104 performs peak limiting.

With reference to FIG. 4C and FIG. 4D, the relationship between the ACP generated in the power amplification section and the power at the receiving band will be described. The above description given with reference to FIG. 4A and FIG. 4B is regarding the leak from a desired channel to an adjacent channel. Here, with reference to FIG. 4C and FIG. 4D, the increase of the power at the receiving band arisen from the distortion by modulation will be described. FIG. 4C shows a power spectrum illustrating the relationship between the PAPR and the specified value when the waveform shaping section 104 does not perform peak limiting. In FIG. 4C, the PAPR is 3.5 dB. FIG. 4D shows a power spectrum illustrating the relationship between the PAPR and the specified value when the waveform shaping section 104 performs peak limiting. In FIG. 4D, the PAPR is 3.0 dB.

As described above with reference to FIG. 4A and FIG. 4B, when the PAPR is decreased as a result of peak limiting, the ACP is increased. In the case of FIG. 4C and FIG. 4D, the waveform shaping section 104 sets the peak limit value such that the PAPR is equal to or larger than 3.0, and thus suppresses the ACP to equal to or smaller than the specified value.

However, an increase in the ACP influences the power at the receiving band. When the PAPR is set to 3.5 dB as in FIG. 4C, the power at the receiving band can be suppressed to smaller than the specified value. By contrast, it is understood from FIG. 4D that when the PAPR is set to 3.0 dB as in FIG. 4D, the power at the receiving band exceeds the specified value. When the power at the receiving band exceeds the specified value as in FIG. 4D, the receiving characteristics is deteriorated.

A peak limit value is preferably set in accordance with either the specified value for the ACP or the specified value for the power at the receiving band, whichever is stricter, such that the ACP and the power at the receiving band are both within the specified value.

Figure 6:
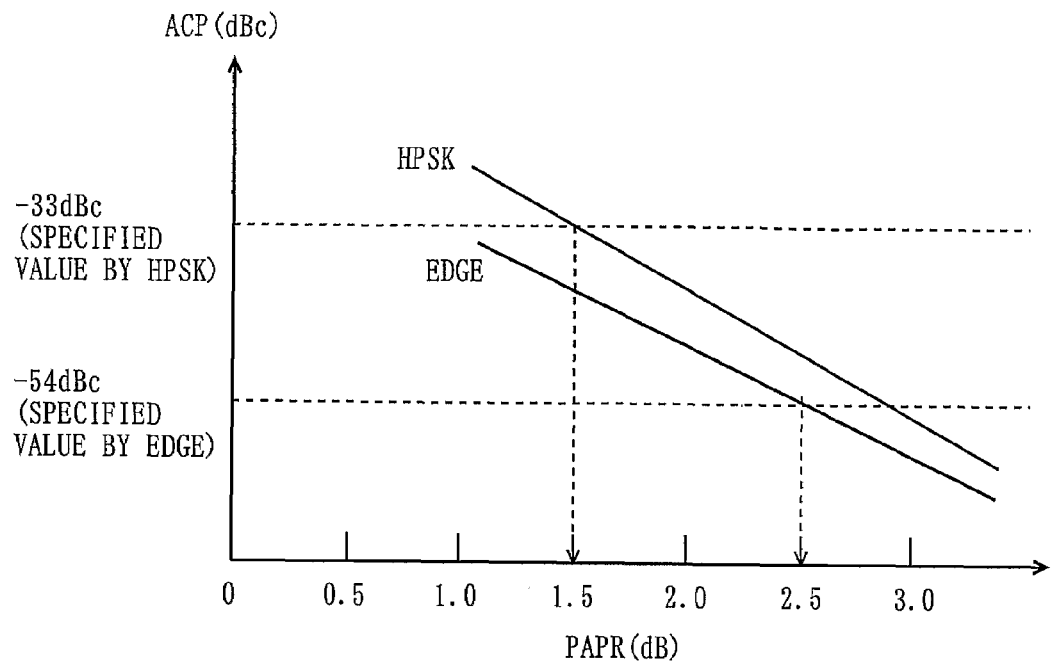
FIG. 6 is a graph illustrating the relationship between the PAPR and the ACP arisen from the distortion by modulation in the case where the HPSK (Hybrid Phase Shift Keying) system and the EDGE system are used as the modulation system.

FIG. 6 is a graph illustrating the relationship between the PAPR and the ACP arisen from the distortion by modulation in the case where the HPSK (Hybrid Phase Shift Keying) system and the EDGE system are used as the modulation system. In FIG. 6, the relationship between the PAPR and the ACP when the amplitude of the second modulated signal of an HPSK signal and the amplitude of the second modulated signal of an EDGE signal are regulated by the waveform shaping section 104.

In the HPSK system, the ACP goes outside the specified value when the PAPR is 1.5 dB or smaller. In the EDGE system, the ACP goes outside the specified value when the PAPR is 2.5 dB or smaller. Accordingly, when adjusting the peak limit value in accordance with the modulation system to be used, the waveform shaping section 104 may change the peak limit value to be appropriate to the respective modulation system to be used, or to be appropriate to all the usable modulation systems. More specifically, the waveform shaping section 104 may adjust the peak limit value in one of the following two manners: (i) When the HPSK system is used, the waveform shaping section 104 adjusts the peak limit value such that the ACP is −33 dBc or smaller, i.e., such that the PAPR is equal to or larger than 1.5 dB; and when the EDGE system is used, the waveform shaping section 104 adjusts the peak limit value such that the ACP is −54 dBc or smaller, i.e., such that the PAPR is equal to or larger than 2.5 dB. (ii) The waveform shaping section 104 adjusts the peak limit value such that the ACP is −54 dBc or smaller, i.e., such that the PAPR is equal to or larger than 2.5 dB when either the HPSK system or the EDGE system is used. In either case, the waveform shaping section 104 adjusts the peak limit value in accordance with the modulation system to be used. Thus, the dynamic range is enlarged.

A second factor for changing the PAPR is a change in the combination of a gain used in a control channel and a gain used in a data channel. Hereinafter, such a combination will be referred to as a "channel condition". With an HSDPA (High Speed Downlink Packet Access) signal, the PAPR of the amplitude signal varies in accordance with the channel condition. In more detail, there are three channels: the DPCCH (Dedicated Physical Control Channel), the DPDCH (Dedicated Physical Data Channel) and ⊿HS-DPCCH. A channel condition is a voltage ratio of the gains in these three channels, i.e., βd:βc:βhs. The PAPR of the amplitude signal varies in accordance with such a channel voltage ratio. The channel voltage ratio is regulated by the output power of the modulated signal which is output from the cellular phone.

Figure 7:
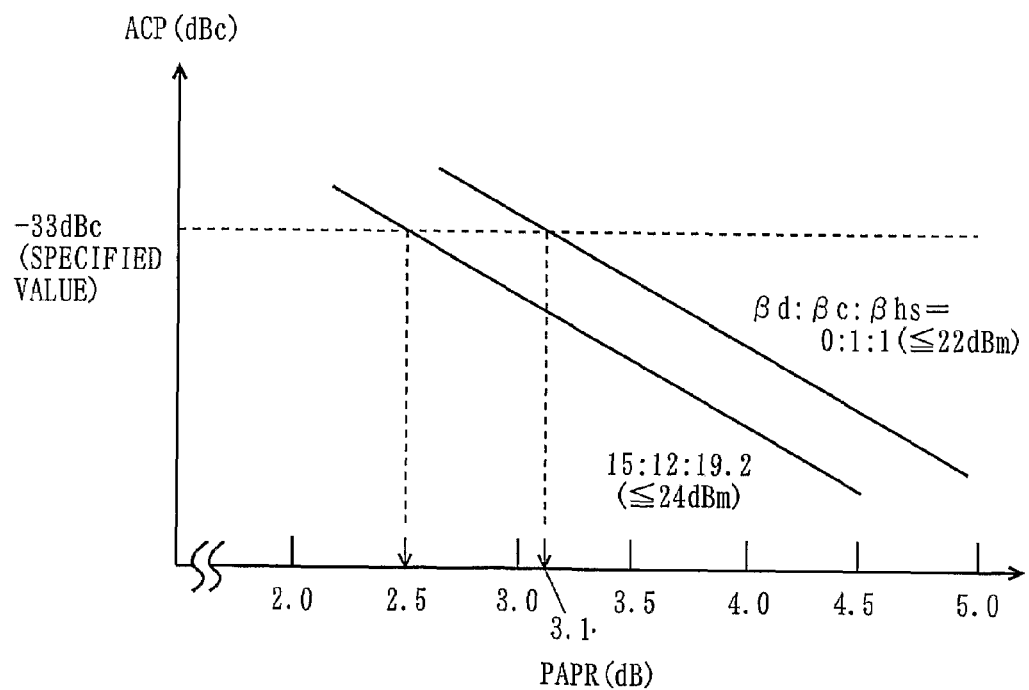
FIG. 7 is a graph illustrating the relationship between the PAPR and the ACP with two channel voltage ratios βd:βc:βhs in the HSDPA system.

FIG. 7 is a graph illustrating the relationship between the PAPR and the ACP at two channel voltage ratios βd:βc:βhs in the HSDPA system. As shown in FIG. 7, the specified value of the ACP in the HSDPA system is −33 dBc. In this case, the gain ratio which exhibits the largest PAPR when the output power of the cellular phone is equal to or smaller than 22 dBm is 0:1:1. When the gain ratio is 0:1:1, the PAPR at which the ACP goes outside the specified value is 3.1 dB. By contrast, the gain ratio which exhibits the largest PAPR when the output power of the cellular phone is equal to or smaller than 24 dBm is 15:12:19.2. When the gain ratio is 15:12:19.2, the PAPR at which the ACP goes outside the specified value is 2.5 dB.

As can be appreciated, in the HSDPA system, the PAPR at which the ACP indicating the distortion by modulation goes outside the specified value varies in accordance with the channel voltage ratio. Namely, the waveform shaping section 104 can enlarge the dynamic range without generating a distortion in the power amplification section 102, by adjusting the peak limit value in accordance with the channel voltage ratio and thus switching the PAPR of the amplitude signal.

A third factor for changing the PAPR is a change in the number of sub carriers used when a multi-carrier modulation system such as, for example, OFDM (Orthogonal Frequency Division Multiplexing) is adopted. The waveform shaping section 104 can change the PAPR also by adjusting the peak limit value in accordance with the number of sub carriers to be used. Thus, the dynamic range can be enlarged. Here, the peak limit value is adjusted in accordance with the number of sub carriers to be used. Alternatively, the PAPR can be changed in accordance with the modulation system used for the sub carrier. For example, for a sub carrier involving significant deterioration in the transmission quality, a modulation system which does not present many errors is used. For a sub carrier involving no significant deterioration in the transmission quality, a high speed modulation system can be used. Namely, the waveform shaping section 104 preferably adjusts the peak limit value in accordance with the condition of the sub carrier.

FIG. 8 is a block diagram showing a functional structure of a polar modulator 100*a* in the case where a predetermined peak limit value is stored in a memory section 111. In FIG. 8, elements having substantially identical functions to those of the polar modulator 100 shown in FIG. 1 bear identical reference numerals thereto, and descriptions thereof will be omitted. In FIG. 8, the memory section 111 stores a plurality of peak limit values. A waveform shaping section 112 reads a necessary peak limit value from the memory section 111 based on the amplitude control signal, and adjusts the peak limit value which is set therein. The memory section 111 may be integrated with the waveform shaping section 112. If the waveform shaping section 112 calculates a predetermined peak limit value based on the amplitude control signal, the memory section 111 is not necessary. Alternatively, a predetermined peak limit value calculated by the waveform shaping section 112 may be stored in the memory section 111, so that the waveform shaping section 112 can perform waveform shaping using the peak limit value stored in the memory section 111 under the same condition.

In the case where there are not many possible peak limit values, the memory section 111, even not having a large capacity, can store the peak limit values. For example, in the case where the peak limit value is adjusted in accordance with the modulation system to be used, the possible peak limit values can be stored in the memory section 111 even if the memory section 111 has a relatively small capacity. However, in the case where there are at least 1000 possible peak limit values, for example, in the case where the peak limit value is adjusted in accordance with the combination of the gain shown in the control channel and the gain shown in the data channel, the capacity of the memory section 111 needs to be quite large in order to store all the possible peak limit values. This increases the cost and the size. In this case, the size of the memory section 111 can be reduced using one of the following two techniques.

According to a first technique, the peak limit value is set in accordance with the output power from the power amplification section 102. The waveform shaping section 112 can recognize the output power from the power amplification section 102 based on the information from the baseband section (not shown in FIG. 8). The waveform shaping section 112 determines whether the recognized output power is within a predetermined threshold value or not. When the recognized output power is within the predetermined threshold value, the waveform shaping section 112 can set, as the peak limit value to be used, a peak limit value corresponding to a PAPR which is set such that the ACP is within the specified value based on the combination of the control channel and the data channel corresponding to an output power of the threshold value. Namely, in the memory section 111, step-by-step peak limit values corresponding to the output powers from the power amplification section 102 are stored. Specifically, it is preferable that step-by-step peak limit values are stored in the memory section 111 so as to correspond to first through n'th output powers registered step by step. The waveform shaping section 112 recognizes the output power from the output amplification section 102, and reads the peak limit value corresponding to the recognized output power from the memory section 111. Thus, the waveform shaping can be performed.

The first technique will be described more specifically using the example shown in FIG. 7. In the memory section 111, a peak limit value at which the PAPR is 3.1 dB is stored as the peak limit value corresponding to an output power of 22 dBm. Also in the memory section 111, a peak limit value at which the PAPR is 2.5 dB is stored as the peak limit value corresponding to an output power of 24 dBm. Based on the amplitude control signal, the waveform shaping section 112 recognizes the output power from the power amplification section 102. When the recognized output power is 24 dBm, the waveform shaping section 112 reads 3.1 dB as the PAPR from the memory section 111 and performs waveform shaping. By contrast, when the recognized output power is equal to or smaller than 22 dBm, the waveform shaping section 112 reads 2.5 dB as the PAPR from the memory section 111 and performs waveform shaping. By storing the step-by-step peak limit values in accordance with the output power from the power amplification 102 in the memory section 111 in this manner, the capacity required of the memory section 111 can be reduced. As a result, the cost and the size are expected to be reduced. It should be noted that since the PAPR can be further reduced when a certain channel voltage ratio is used, the above-described technique may result in reducing the effect of enlarging the dynamic range. In order to avoid this, the number of peak limit values to be stored in the memory section 111 should be appropriately designed in consideration of the dynamic range to be used in the power amplification section 102 and the memory capacity.

In addition to reduction in the size of the memory section 111, there is another advantage provided by switching the peak limit value in accordance with the output power. In the case where the non-linearity of the power amplification section 102 varies in accordance with the output power, a signal output from the power amplification section 102, although being based on an amplitude signal of the same PAPR, deteriorates by a different degree in the modulation characteristic. For example, when the output power from the power amplification section 102 is small, the modulation characteristic of the signal caused by the non-linearity of the power amplification section 102 maybe significantly deteriorated. In such a case, the peak limit value is preferably set such that a high PAPR can be obtained without causing the ACP to go outside the specified value. Namely, when the output power is smaller than a predetermined threshold value, the memory section 111 preferably stores a peak limit value which allows the precision of the modulated signal to be equal to or larger than a predetermined value as well as keeping the ACP within the specified value. For example, referring to FIG. 7, it is assumed that a peak limit value is set such that a PAPR (2.5 dB) is obtained at which the ACP is within the specified value of −33 dBc at an output power equal to or smaller than 22 dBm. If the modulation precision is smaller than the predetermined value in this state, the memory section 111 preferably stores a peak limit value at which the PAPR is larger than 2.5 dB. Alternatively, the memory section 111 may be set such that when the output power is equal to or smaller than the minimum threshold value, peak limiting is not performed, i.e., there is no peak limit value (the amplitude may be infinite). Such a setting can suppress the modulated signal which is output from the power amplification section 102 from being deteriorated.

A second technique for reducing the size of the memory section 111 will be described. According to the second technique, the memory section 111 stores a predetermined peak limit value in accordance with the voltage ratio of only the DPCCH and the DPDCH included in the HSDPA signal. Thus, the size of the memory section 111 can be reduced. However, with this technique also, there are channel voltage ratios with which the PAPR shows a smaller value. In this case, the effect of enlarging the dynamic range is reduced. In order to avoid this as much as possible, it is not preferable to determine the PAPR based only on the channel voltage ratio of the DPCCH and the DPDCH. For example, when the channel voltage ratio of the DPCCH and the DPDCH is within a certain range, it is effective to store a peak limit value at which a PAPR is at a desirable value using the ⊿HS-DPCCH as a parameter.

Techniques for reducing the size of the memory section 111 can be designed when necessary, and are not limited to the above-described two techniques.

As described above, according to the first embodiment, the waveform shaping section 104 adjusts the predetermined regulated value in accordance with a factor for changing the distorted power generated by the power amplification section 102, such that the ACP generated in the power amplification section 102 becomes equal to or smaller than the first predetermined value, or such that the power at the receiving band becomes equal to or smaller than the second predetermined value. The waveform shaping section 104 then shapes the waveform of the second modulated signal in accordance with the adjusted predetermined regulated value, and outputs the resultant signal. Accordingly, the polar modulator 100 can suppress the ACP included in the third modulation which is output from the power amplification section 102 within the specified value, or can maintain the power at the receiving band within the specified value. Namely, the polar modulator 100 appropriately limits the peak value of the second modulated signal. Thus, even if a factor for changing the distorted power is generated, and even if the amplifying element used in the power amplification section 102 does not have linearity in a wide range, the polar modulator 100 can obtain a third modulated signal with the ACP suppressed or with the power at the receiving band maintained.

The amount of the distorted power generated by the power amplification section 102 is determined in accordance with the power value of the first modulated signal. Therefore, the distorted power generated by the power amplification section 102 can be suppressed by the waveform shaping section 104 adjusting a predetermined regulated value in accordance with the power value of the first modulated signal.

The amount of the distorted power generated by the power amplification section 102 is determined in accordance with the amplitude value of the second modulated signal. Therefore, the distorted power generated by the power amplification section 102 can be suppressed by the waveform shaping section 104 adjusting a predetermined regulated value in accordance with the amplitude value of the second modulated signal.

The leak amount of the distortion component to an adjacent channel is changed by a change in the PAPR. For example, the adjacent channel power ratio (ACPR) is changed by a change in the PAPR. Accordingly, the ACPR is usable as an index of the amount of the ACP. The ACPR can be regulated to be equal to or smaller than a predetermined value by the waveform shaping section 104 adjusting a predetermined regulated value in accordance with a factor for changing the PAPR. Thus, the ACP included in the third modulated signal which is output from the power amplification section 102 is reduced to equal to or smaller than a predetermined value. Namely, by limiting the peak value of the second modulated signal, the polar modulator 100 can obtain a third modulated component with the distortion component suppressed even if the amplification element used in the power amplification section 102 does not have linearity in a wide range.

The PAPR varies in accordance with the combination of the gain shown in the control channel and the gain shown in the data channel. Accordingly, the ACP included in the third modulated signal can be reduced to equal to or smaller than a predetermined value by the waveform shaping section 104 adjusting a predetermined regulated value in accordance with the combination of the gain shown in the control channel and the gain shown in the data channel.

In the case where a multi-carrier modulation system is used, the PAPR varies in accordance with the modulation rule of each sub carrier to be used. Accordingly, the ACP included in the third modulated signal can be reduced to equal to or smaller than a predetermined value by the waveform shaping section 104 adjusting a predetermined regulated value in accordance with the number of the sub carriers used.

In the case where a plurality of modulation systems are usable, the PAPR varies in accordance with the modulation systems to be used. Accordingly, the ACP included in the third modulated signal can be reduced to equal to or smaller than a predetermined value by the waveform shaping section 104 adjusting a predetermined regulated value in accordance with the modulation systems to be used. HSDPA and HPSK are based on the 3GPP standard.

Second Embodiment

Figure 9:
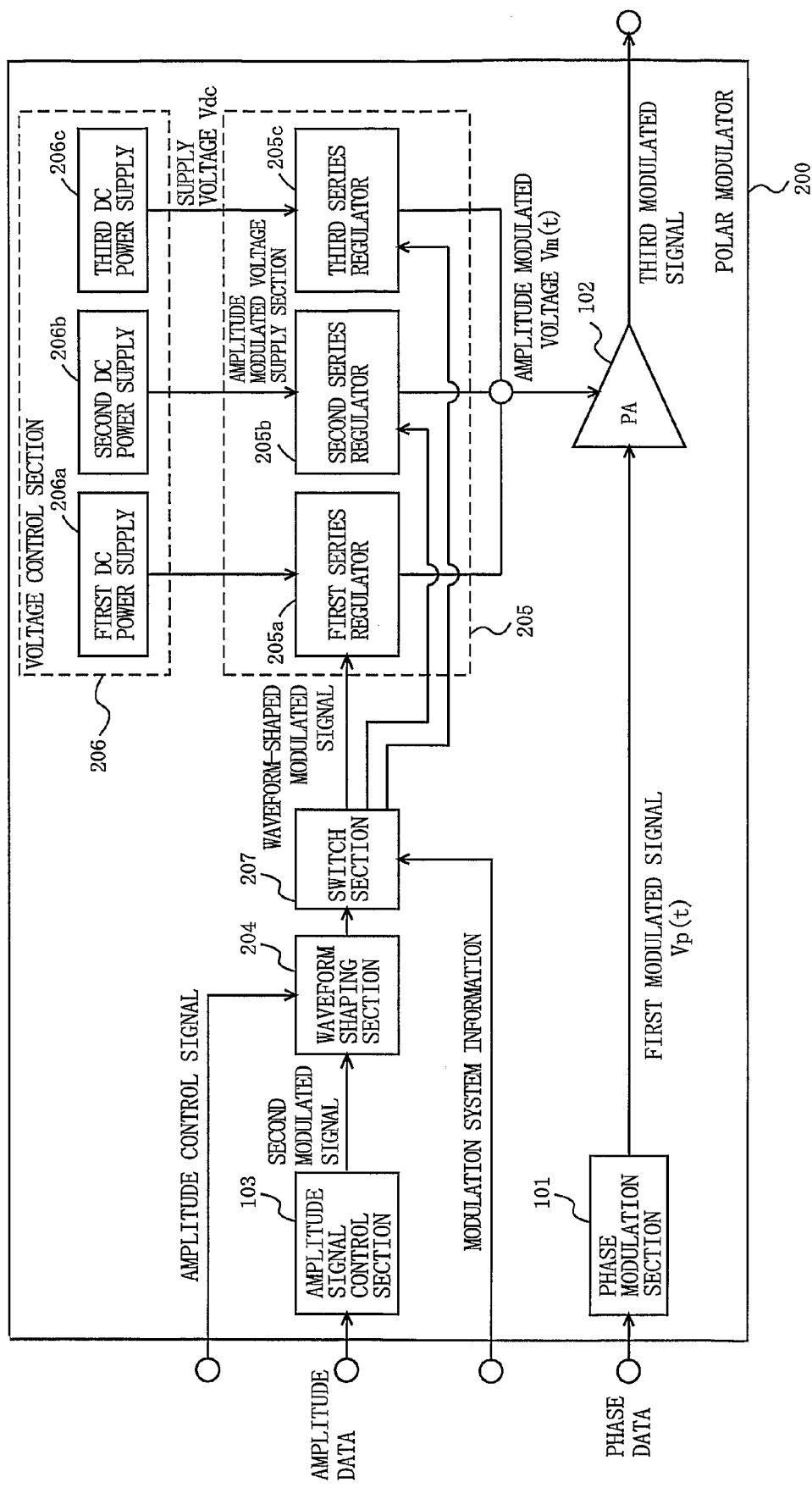
FIG. 9 is a block diagram showing a functional structure of a polar modulator 200 according to a second embodiment of the present invention.

FIG. 9 is a block diagram showing a functional structure of a polar modulator 200 according to a second embodiment of the present invention. In FIG. 9, elements having substantially identical functions to those of the polar modulator 100 shown in FIG. 1 bear identical reference numerals thereto, and descriptions thereof will be omitted. The polar modulator 200 includes a phase modulation section 101, a power amplification section 102, an amplitude signal control section 103, a waveform shaping section 204, an amplitude modulated voltage supply section 205, a voltage control section 206, and a switch section 207.

The voltage control section 206 includes first through third DC power supplies 206a, 206b and 206c capable of outputting a plurality of different supply voltages from one another.

The amplitude modulated voltage supply section 205 includes first through third series regulators 205a, 205b and 205c respectively provided in correspondence with the first through third DC power supplies 206a, 206b and 206c. The first through third series regulators 205a, 205b and 205c respectively amplify a waveform-shaped modulated signal using a transistor based on the supply voltage supplied from the first through third DC power supplies 206a, 206b and 206c, and supply the amplified signal to the power amplification section 102 as an amplitude modulated voltage Vm(t). For an exemplary circuit configuration of the first through third series regulators 205a, 205b and 205c, FIG. 2 is incorporated by reference. In this embodiment, three DC power supplies and three series regulators are shown, but the number of the DC power supplies and the series regulators is not limited to three.

The switch section 207 inputs the waveform-shaped modulated signal generated by the waveform shaping section 204 to one of the series regulators. The switch section 207 operates so as to input the waveform-shaped modulated signal to a series regulator which is provided by a corresponding DC power supply with a supply voltage capable of realizing a high efficiency. Specifically, for example, the switch section 207 preferably recognizes a peak limit value of the waveform-shaped modulated signal and inputs the waveform-shaped modulated signal to a series regulator corresponding to the DC power supply which provides a supply voltage closest to the peak limit value. Thus, the power utilization efficiency is improved.

For example, it is assumed that a waveform-shaped modulated signal for outputting a peak-limited amplitude modulated voltage Vm(t) having a maximum voltage of 2.9 V and a minimum voltage of 0.5 V is input to the switch section 207. The switch section 207 preferably selects the first regulator 205a during the time when the amplitude modulated voltage Vm(t) is equal to or higher than 2.0 V and lower than 2.9 V, selects the second regulator 205b during the time when the amplitude modulated voltage Vm(t) is equal to or higher than 1.0 V and lower than 1.9 V, and selects the third regulator 205c during the time when the amplitude modulated voltage Vm(t) is equal to or higher than 0.5 V and lower than 1.0 V.

As described above, according to the second embodiment, a plurality of series regulators are combined with a peak limiter, so that one appropriate series regulator which is capable of improving the efficiency is selected out of the plurality of series regulators. In this manner, as compared to the case of a polar modulator including only one series regulator, the loss in the series regulators can be reduced and thus the high efficiency can be realized.

It is assumed that the polar modulator 200 is capable of outputting a signal using any of a plurality of modulation systems. The modulation system to be used is a factor for changing the distorted power generated by the power amplification section 102. Therefore, the waveform shaping section 204 recognizes the modulation system to be used based on the amplitude control signal and adjusts the peak limit value in accordance with the modulation system to be used. The switch section 207 has modulation system information regarding the modulation system to be used. The switch section 207 selects the series regulator, to which the waveform-shaped modulated signal is to be input, in accordance with the modulation system to be used. With a different modulation system, the peak limit value is different. Therefore, the switch section 207 switches the series regulators such that an appropriate supply voltage and an appropriate series regulator are used. Thus, the power utilization efficiency is further improved.

Third Embodiment

Figure 10:
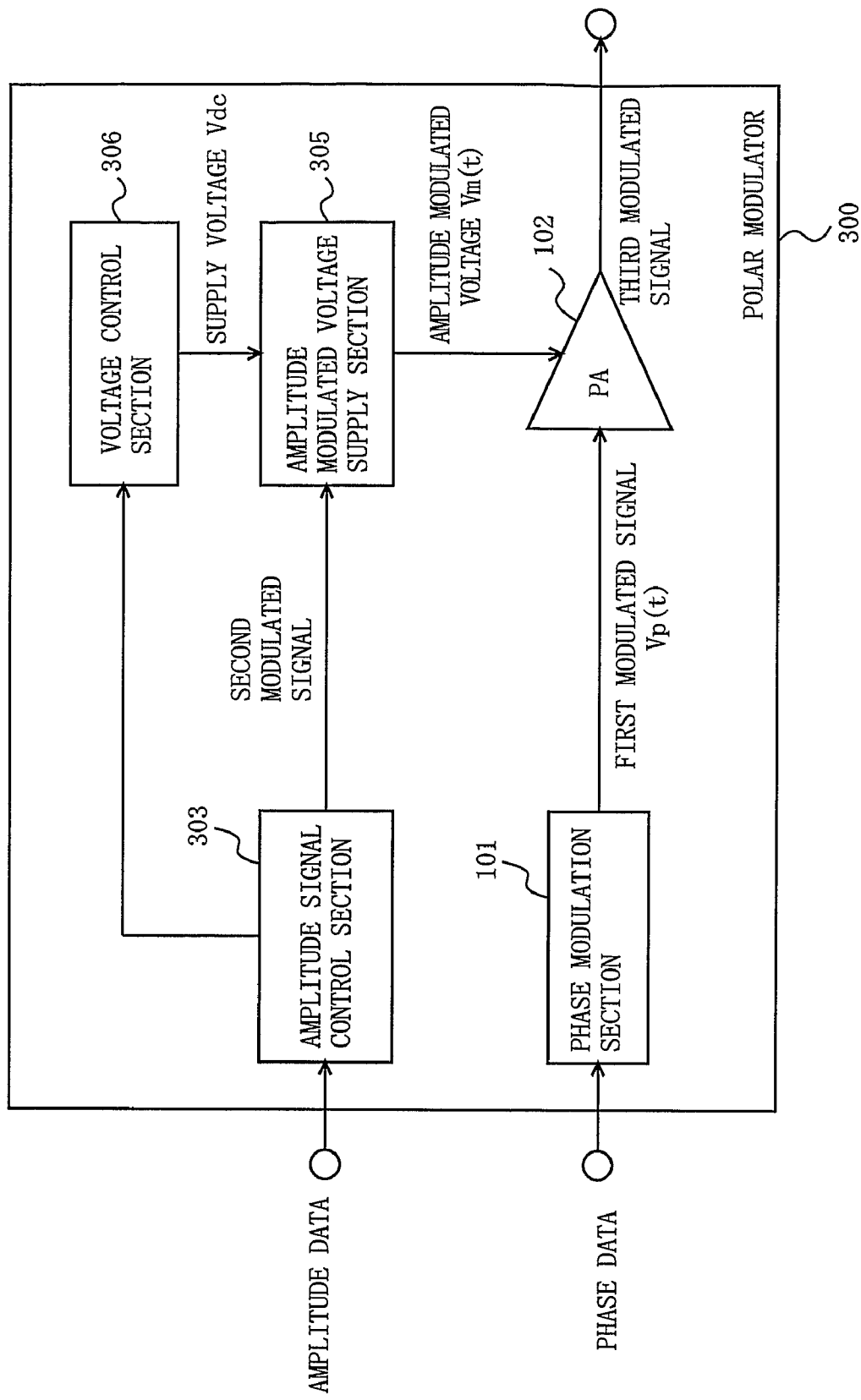
FIG. 10 is a block diagram showing a functional structure of a polar modulator 300 according to a third embodiment of the present invention.

FIG. 10 is a block diagram showing a functional structure of a polar modulator 300 according to a third embodiment of the present invention. In FIG. 10, elements having substantially identical functions to those of the polar modulator 100 shown in FIG. 1 bear identical reference numerals thereto, and descriptions thereof will be omitted. The polar modulator 300 includes a phase modulation section 101, a power amplification section 102, an amplitude signal control section 303, an amplitude modulated voltage supply section 305, and a voltage control section 306.

The amplitude signal control section 303 has substantially the same function as that of the amplitude signal control section 103 in the first embodiment except for inputting the second modulated signal to the voltage control section 306 and the amplitude modulated voltage supply section 305.

The amplitude modulated voltage supply section 305 includes a transistor. The amplitude modulated voltage supply section 305 amplifies a second modulated signal which is input from the amplitude signal control section 303, using the transistor based on the supply voltage which is input from the voltage control section 306, and supplies the amplified signal to the power amplification section 102 as an amplitude modulated voltage Vm(t).

The voltage control section 306 recognizes the maximum value of the amplitude modulated voltage which is output from the transistor of the amplitude modulated voltage supply section 305 based on the second modulated signal which is input from the amplitude signal control section 303, and inputs a voltage obtained based on the maximum value to the amplitude modulated voltage supply section 305 as a supply voltage Vdc. The supply voltage Vdc obtained based on the maximum value will be described later in detail.

Figure 11:
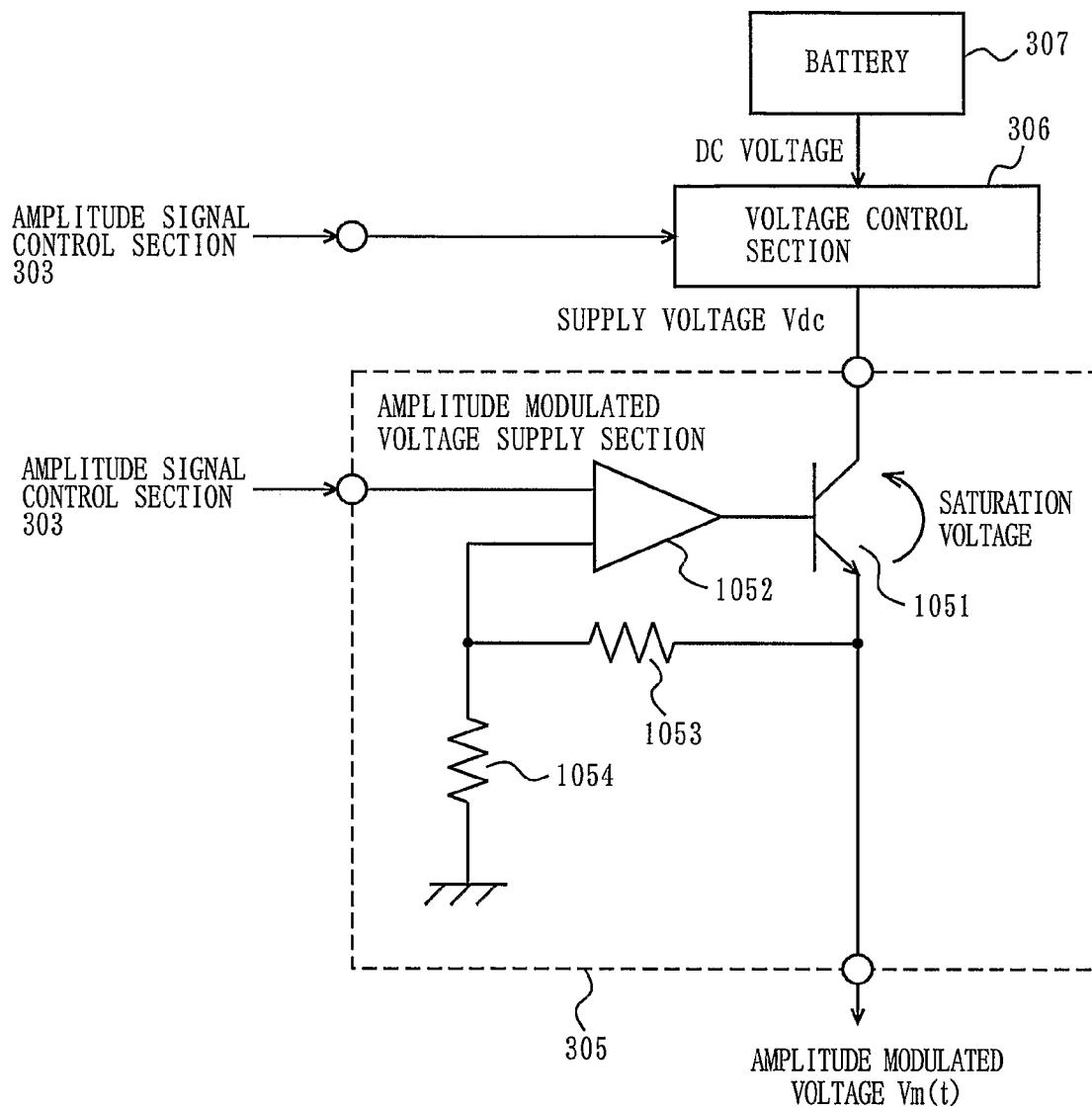
FIG. 11 shows a circuit configuration of an amplitude modulated voltage supply section 305 and connections of elements in the vicinity thereof.

FIG. 11 shows a circuit configuration of the amplitude modulated voltage supply section 305 and connections of elements in the vicinity thereof. The voltage control section 306 is a switching regulator. The voltage control section 306 is provided with a DC voltage from a battery 307. The amplitude modulated voltage supply section 305 is provided with a supply voltage from the voltage control section 306. The circuit configuration of the amplitude modulated voltage supply section 305 is substantially the same as that of the amplitude modulated voltage supply section 105 shown in FIG. 2, except that the OP amplifier 1052 receives the second modulated signal from the amplitude signal control section 303. The amplitude modulated voltage supply section 305 is preferably structured as a series regulator as described above. However, the amplitude modulated voltage supply section 305 may have any other structure than that of a series regulator as long as the second modulated signal is amplified. The transistor used in the amplitude modulated voltage supply section 305 is not limited to a bipolar transistor, and may be a MOS transistor. The waveform-shaped modulated signal amplified by the transistor 1051 is supplied to the power amplification section 102 as the amplitude modulated voltage Vm(t).

As shown in FIG. 11, the transistor 1051 included in the amplitude modulated voltage supply section 305 includes a saturation voltage (for example, 0.1 V) between an emitter and a collector thereof. Accordingly, the collector of the transistor 1051 needs to be provided with, as the supply voltage Vdc, a voltage obtained as a result of adding the maximum value of the amplitude modulated voltage Vm(t) and a voltage equal to or higher than 0.1 V. Otherwise, the transistor 1051 is saturated and becomes inoperable. Therefore, the voltage control section 306 preferably estimates the maximum value of the amplitude modulated voltage Vm(t) from the second modulated signal and supplies a voltage, obtained as a result of adding the maximum value and a constant voltage (for example, 0.1 V) determined based on the saturation voltage of the transistor 1051, to the amplitude modulated voltage supply section 305 as the supply voltage Vdc.

Figure 12:
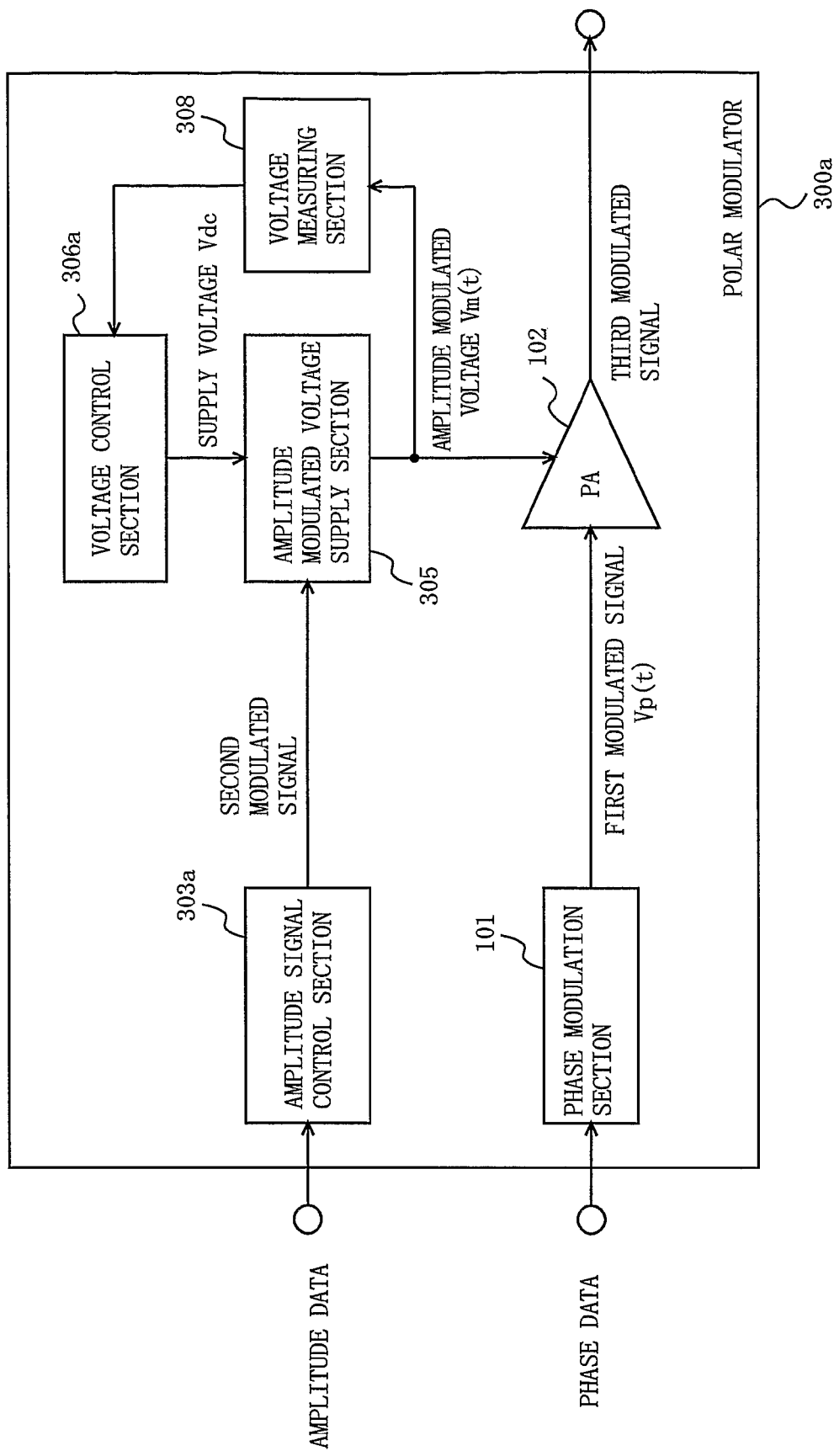
FIG. 12 is a block diagram showing a functional structure of a polar modulator 300a for obtaining the maximum value of an amplitude modulated voltage Vm(t) using a voltage measuring section 308.

The method for obtaining the maximum value of the amplitude modulated voltage Vm(t) is not limited to the one described above with reference to FIG. 10. FIG. 12 is a block diagram showing a functional structure of a polar modulator 300a for obtaining the maximum value of the amplitude modulated voltage Vm(t) using a voltage measuring section 308. In FIG. 12, an amplitude signal control section 303a does not input the second modulated signal to a voltage control section 306a. Instead, the voltage measuring section 308 detects the maximum value of the amplitude modulated voltage Vm(t) which is output from the amplitude modulated voltage supply section 305, and inputs the detected maximum value to the voltage control section 306a. The voltage control section 306a obtains the supply voltage Vdc based on the detected maximum value of the amplitude modulated voltage Vm(t) detected by the voltage measuring section 308, and supplies the supply voltage Vdc to the amplitude modulated voltage supply section 305. In this operation, the voltage control section 306a preferably supplies a voltage, obtained as a result of adding the maximum value and a constant voltage (for example, 0.1 V) determined based on the saturation voltage of the transistor 1051, to the amplitude modulated voltage supply section 305 as the supply voltage Vdc.

The voltage control section 306 shown in FIG. 10 may obtain the supply voltage Vdc by obtaining the maximum value of the amplitude modulated voltage Vm(t) based on the amplitude information which is input from the baseband section (not shown in FIG. 10), instead of obtaining the maximum value from the second modulated signal.

In the above description, the voltage control section 306, 306a obtains the supply voltage Vdc by adding the maximum value of the amplitude modulated voltage V m(t) and a constant value obtained based on the saturation voltage. The value of the supply voltage Vdc is not limited to a value thus obtained.

Figure 13:
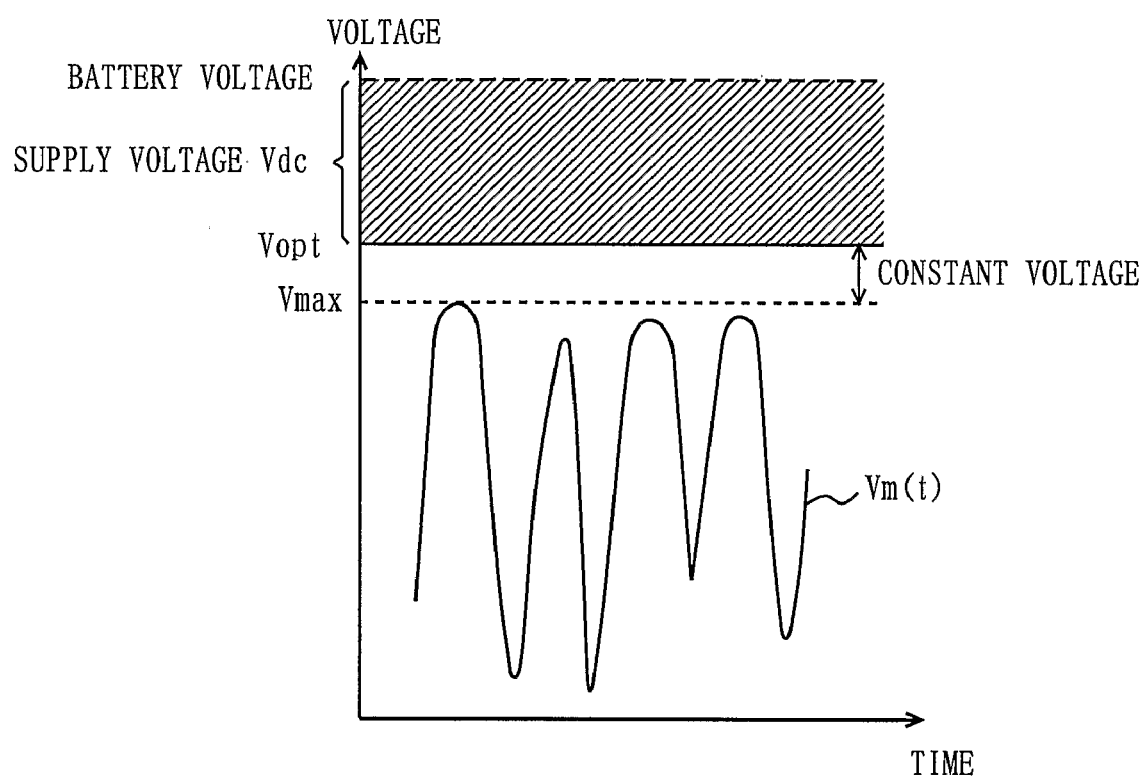
FIG. 13 illustrates a range of values of supply voltage Vdc.

FIG. 13 illustrates a range of values of supply voltage Vdc. In FIG. 13, Vmax represents the maximum value of the amplitude modulated voltage Vm(t). Vopt represents the value of supply voltage obtained as a result of adding Vmax and a constant voltage. Vopt corresponds to the supply voltage Vdc used in FIG. 10 and FIG. 12. By using Vopt as the supply voltage, the power utilization efficiency can be improved to the highest possible level without saturating the transistor 1051 included in the amplitude modulated voltage supply section 305. However, the value of the supply voltage Vdc is not limited to Vopt as long as the object of improving the power utilization efficiency while preventing the transistor 1051 from being saturated is achieved. Namely, the voltage control section 306, 306a merely needs to supply a voltage, which is higher than the voltage Vopt obtained as a result of adding the maximum value Vmax of the amplitude modulated voltage and a constant voltage determined based on the saturation voltage of the transistor 1051 and is lower than the battery voltage supplied from the battery 307, to the amplitude modulated voltage supply section 305 as the supply voltage Vdc. In this case, as the supply voltage Vdc is closer to Vopt, the power utilization efficiency is improved.

As shown in FIG. 13, when the supply voltage Vdc higher than Vopt is applied to the amplitude modulated voltage supply section 305, the operation efficiency may be lowered. Accordingly, it is ideal that the voltage control section 306, 306a applies Vopt to the amplitude modulated voltage supply section 305. However, when the output power from the power amplification section 102 is controlled (i.e., at the time of power control), the maximum value of the amplitude modulated voltage Vm(t) also changes. Therefore, the voltage control section 306, 306a preferably changes Vopt based on the maximum value. Alternatively, the voltage control section 306, 306a may recognize in advance the changing width of the maximum value of the amplitude modulated voltage Vm(t) and obtain the supply voltage Vdc based on the maximum value within the changing width. In this case, the supply voltage Vdc may possibly become higher than Vopt instantaneously, but the voltage control section 306, 306a does not need to change the supply voltage Vdc.

As described above, the voltage control section 306, 306a determines the supply voltage Vdc. In other words, the voltage control section 306, 306a supplies a supply voltage Vdc, which allows the transistor 1051 included in the amplitude modulated voltage supply section 305 to operate in a constant current range, to the amplitude modulated voltage supply section 305. The "constant current range" means a range in which the value of the collector (drain) current is within a constant range in the relationship between the collector-emitter (drain-source) voltage and the collector (drain) current of the transistor. In the case where a transistor is a bipolar transistor, a non-saturation range is generally the constant current range. In the case where a transistor is a MOS transistor, a saturation range is generally the constant current range.

As described above, according to the third embodiment, the polar modulator 300, 300a can control the supply voltage Vdc to have an appropriate value based on the maximum value of the amplitude modulated voltage Vm(t). Therefore, an unnecessary voltage can be prevented from being supplied to the amplitude modulated voltage supply section 305. As a result, the power utilization efficiency can be improved. By controlling the supply voltage Vdc supplied to the amplitude modulated voltage supply section 305 to be have an appropriate value, the transistor included in the amplitude modulated voltage supply section 305 can be prevented from being saturated. As a result, a distortion can be prevented from being generated due to the saturation of the transistor.

By detecting the maximum value of the amplitude modulated voltage Vm(t) using the voltage measuring section 308, the supply voltage Vdc can be controlled at a higher precision. Therefore, the power utilization efficiency can be further improved.

Fourth Embodiment

Figure 14:
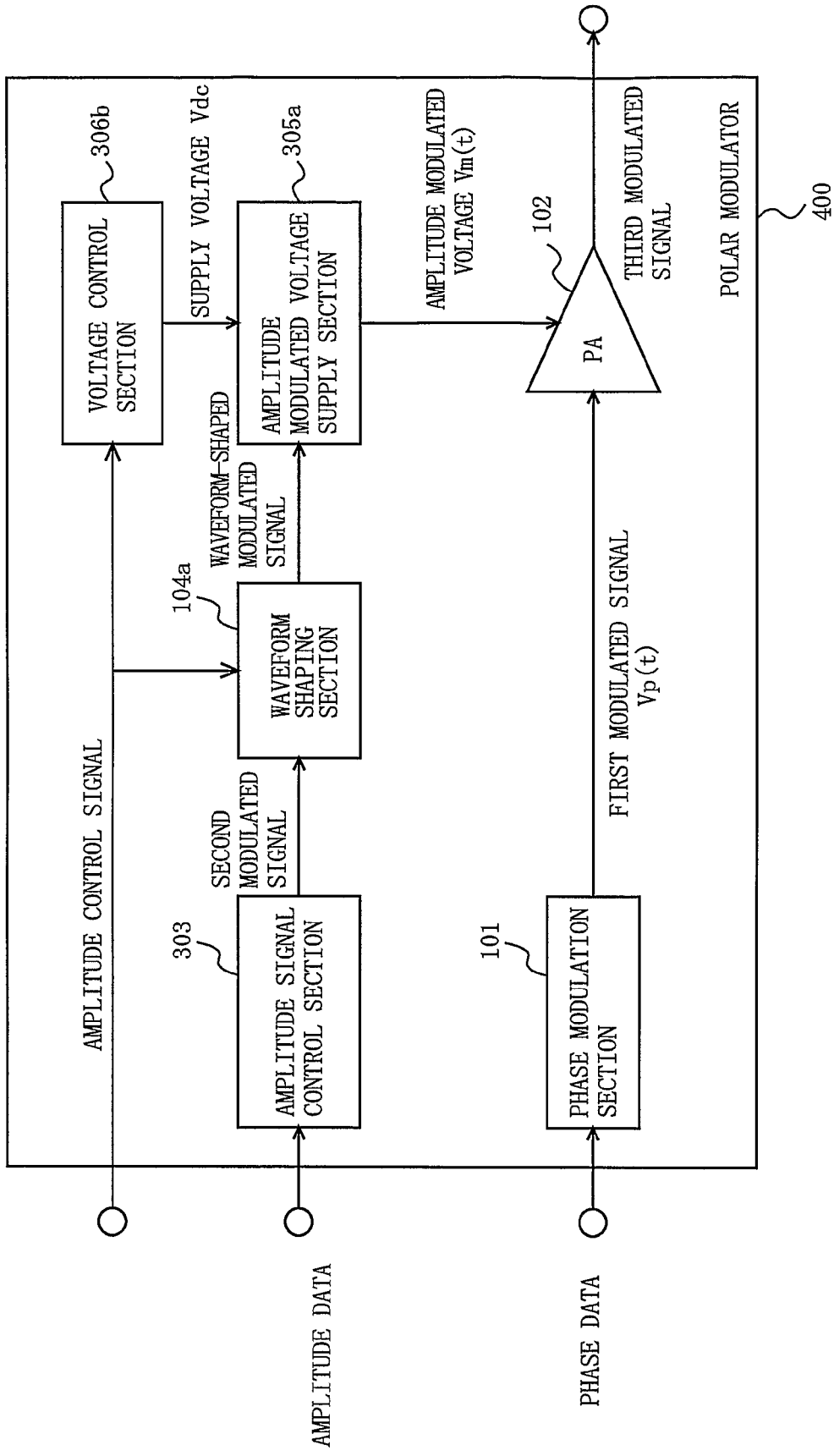
FIG. 14 is a block diagram showing a functional structure of a polar modulator 400 according to a fourth embodiment of the present invention.

FIG. 14 is a block diagram showing a functional structure of a polar modulator 400 according to a fourth embodiment of the present invention. In FIG. 14, elements having substantially identical functions to those of the polar modulator 100 shown in FIG. 1 and the polar modulator 300 shown in FIG. 10 bear identical reference numerals thereto, and descriptions thereof will be omitted.

As shown in FIG. 14, the polar modulator 400 includes a phase modulation section 101, a power amplification section 102, an amplitude signal control section 303, a waveform shaping section 104a, an amplitude modulated voltage supply section 305a, and a voltage control section 306b. The polar modulator 400 is different from the polar modulator 100 shown in FIG. 1 in that a waveform-shaped modulated signal is input from the waveform shaping section 104a to the voltage control section 306b.

The voltage control section 306b recognizes the maximum value of an amplitude modulated voltage Vm(t) based on the waveform-shaped modulated signal, and supplies a voltage obtained based on the maximum value to the amplitude modulated voltage supply section 305a as a supply voltage Vdc. The supply voltage Vdc can be obtained by any method shown in the third embodiment. The waveform-shaped modulated signal is obtained by limiting the peak value of the second modulated signal. Thus, it is considered that the amplitude modulated voltage supply section 305a outputs the amplitude modulated voltage Vm(t) as a result of amplifying the second modulated signal.

Like in the first embodiment, when the amplitude of the second modulated signal is larger than a predetermined peak limit value, the waveform shaping section 104a generates a waveform-shaped modulated signal obtained as a result of shaping the waveform of the second modulated signal, such that the amplitude of a portion of the second modulated signal which exceeds the predetermined peak limit value becomes equal to or smaller than the predetermined peak limit value. In the fourth embodiment, the supply voltage Vdc is controlled by the voltage control section 306a to improve the efficiency. Therefore, unlike in the first embodiment, the effect of improving the efficiency can be realized without the waveform shaping section 104a changing the predetermined peak limit value based on the amplitude modulated signal.

Like in the first embodiment, the waveform shaping section 104a may adjust the peak limit value in accordance with a factor for changing the distorted power generated by the power amplification section 102, the factor being obtained by the amplitude control signal, such that the ACP generated in the power amplification section 102 becomes equal to or smaller than the first predetermined value, and/or such that the power at the receiving band becomes equal to or smaller than the second predetermined value. Thus, the dynamic range is enlarged.

The polar modulator 400 may include a voltage measuring section 308 as shown in FIG. 12. In this case, the voltage control section 306b may determine the supply voltage Vdc based on the maximum value detected by the voltage measuring section 308. The voltage control section 306b may obtain the maximum value of the amplitude modulated voltage Vm(t) based on the amplitude information from the baseband section (not shown in FIG. 14) and thus determine the supply voltage Vdc.

FIG. 15A and FIG. 15B illustrate the control performed by the voltage control section 306b. As shown in FIG. 15A, the voltage control section 306b preferably supplies a voltage Vopt, obtained as a result of adding the maximum value Vmax of the amplitude modulated voltage Vm(t) (peak limit value) and a constant voltage corresponding to the saturation voltage of the transistor included in the amplitude modulated voltage supply section 305a, to the amplitude modulated voltage supply section 305a as the supply voltage Vdc. The supply voltage Vdc may be lower than the battery voltage and higher than the voltage Vopt. As shown in FIG. 15B, when the peak limit value (the maximum value Vmax) is changed by the waveform shaping section 104a, the voltage control section 306b preferably changes the voltage Vopt which is optimum as the supply voltage.

Figure 16A:
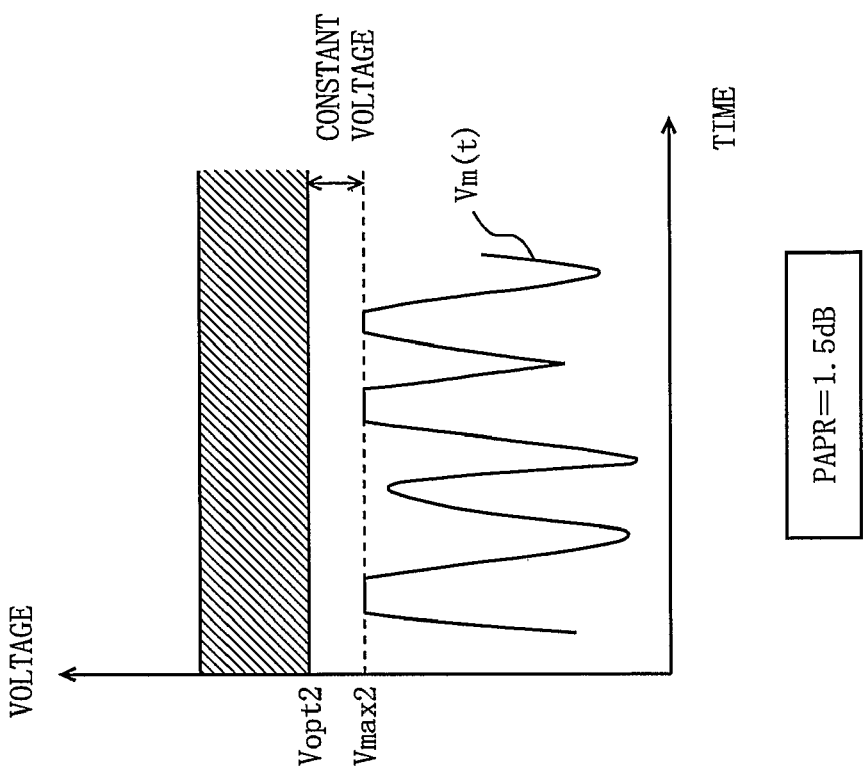
FIG. 16A illustrates the amplitude modulated voltage Vm(t) and the supply voltage Vdc of an HPSK signal when the PAPR is 2.5 dB.
Figure 16B:
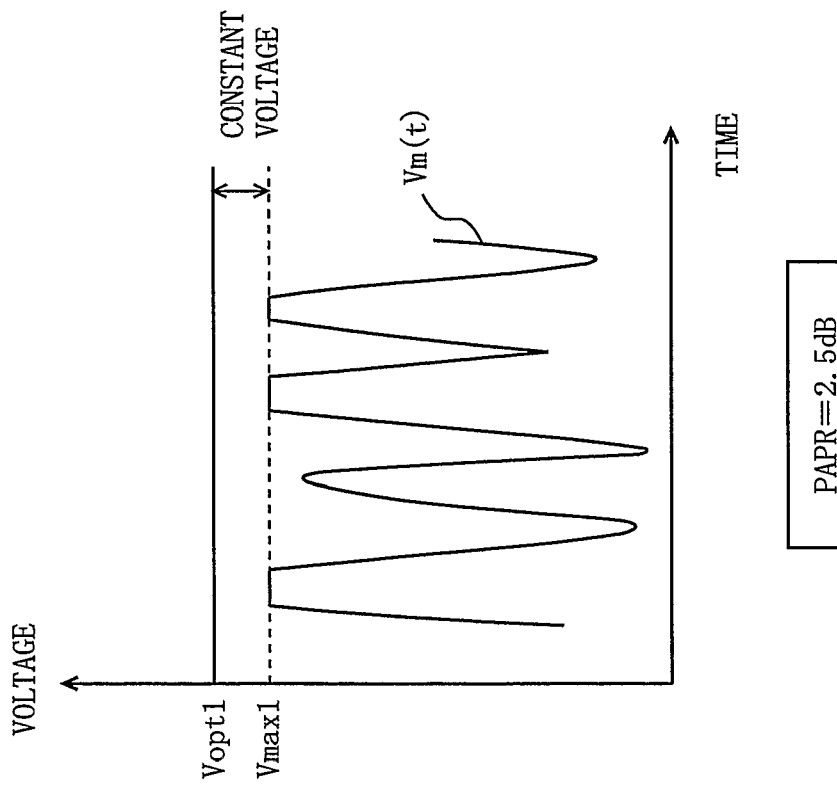
FIG. 16B illustrates the amplitude modulated voltage Vm(t) and the supply voltage Vdc of the HPSK signal when the PAPR is 1.5 dB.

FIG. 16A illustrates the amplitude modulated voltage Vm(t) and the supply voltage Vdc of an HPSK signal when the PAPR is 2.5 dB. FIG. 16B illustrates the amplitude modulated voltage Vm(t) and the supply voltage Vdc of the HPSK signal when the PAPR is 1.5 dB. As can be appreciated by comparing FIG. 16A and FIG. 16B, a supply voltage Vopt1 which is optimum when the PAPR is 2.5 dB and a supply voltage Vopt2 which is optimum when the PAPR is 1.5 dB are different from each other by the portion represented with hatching in FIG. 16B. Namely, if the supply voltage Vopt1 is used when the PAPR is 1.5 dB, the power corresponding to the hatched portion is wasted. Therefore, the supply voltage Vdc which is output from the voltage control section 306b preferably varies based on the maximum value of the amplitude modulated voltage Vm(t) instead of being constant. Thus, a wasteful power consumption can be reduced.

As described above, according to the fourth embodiment, when the amplitude of the second modulated signal is larger than a predetermined peak limit value, the peak portion of the second modulated signal is cut off. Therefore, the maximum value of the amplitude modulated voltage Vm(t) which is output from the transistor is reduced. Since the voltage control section 306b determines the supply voltage Vdc based on the maximum value of the amplitude modulated voltage Vm(t), the difference between the voltage of the cut-off peak portion and the supply voltage Vdc can be minimized. Thus, the power utilization efficiency is improved.

By the waveform shaping section 104a adjusting the peak limit value, the dynamic range can be enlarged.

Fifth Embodiment

Figure 17:
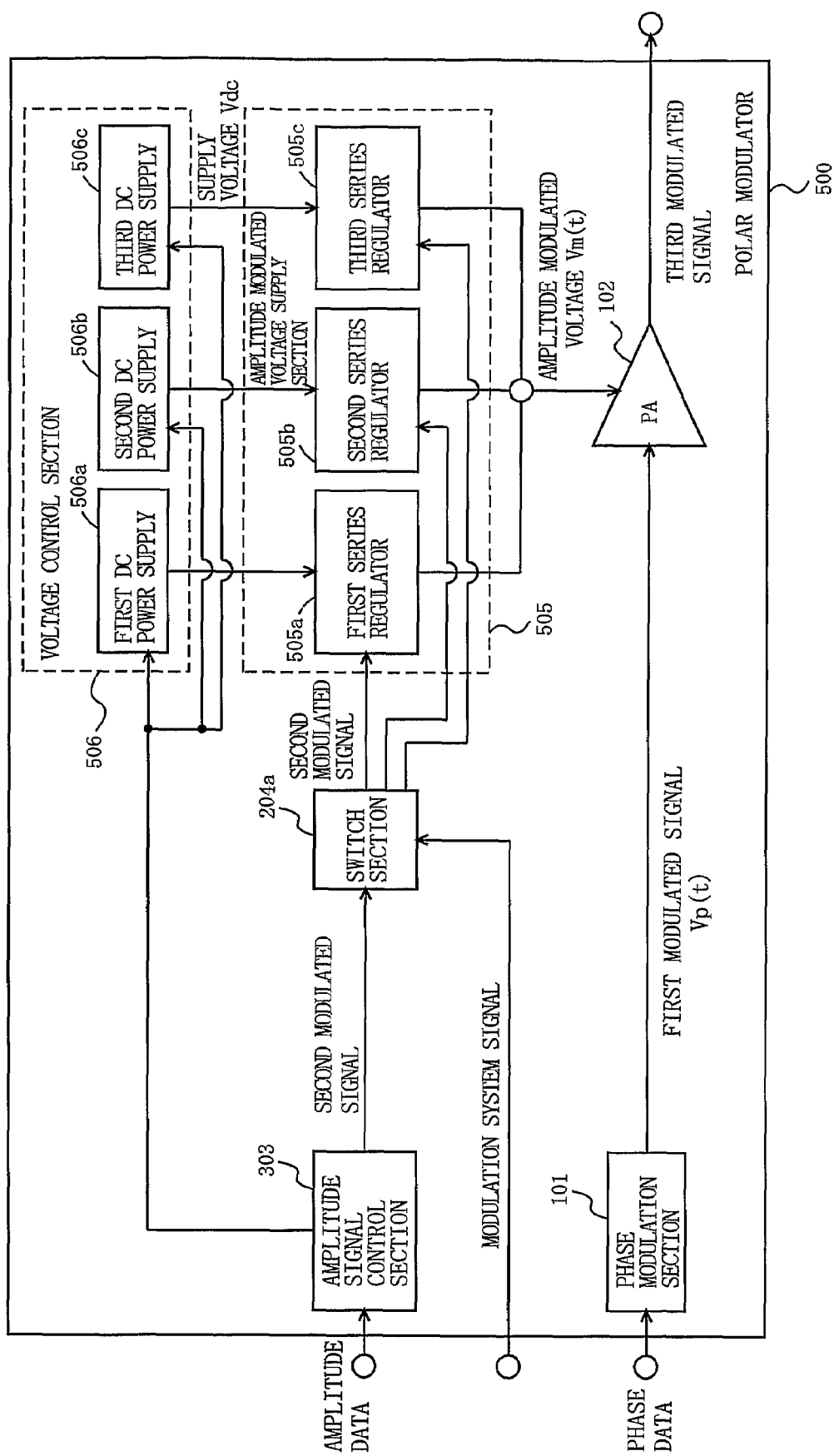
FIG. 17 is a block diagram showing a functional structure of a polar modulator 500 according to a fifth embodiment of the present invention.

FIG. 17 is a block diagram showing a functional structure of a polar modulator 500 according to a fifth embodiment of the present invention. As shown in FIG. 17, the polar modulator 500 includes a phase modulation section 101, a power amplification section 102, an amplitude signal control section 303, a switch section 204a, an amplitude modulated voltage supply section 505, and a voltage control section 506. In FIG. 17, elements having substantially identical functions to those of the first through third embodiments bear identical reference numerals thereto, and descriptions thereof will be omitted. The amplitude modulated voltage supply section 505 includes first through third series regulators 505a, 505b and 505c. The voltage control section 506 includes first through third DC power supplies 506a, 506b and 506c capable of outputting a plurality of different supply voltages from one another. The number of the DC power supplies and the series regulators is not limited to three as shown in FIG. 17.

The switch section 204a inputs a second modulated signal which is output from the amplitude signal control section 303 to one of the series regulators.

The first through third series regulators 505a, 505b and 505c are respectively provided in correspondence with the first through third DC power supplies 506a, 506b and 506c. The first through third series regulators 505a, 505b and 505c respectively amplify the second modulated signal using a transistor based on the supply voltage Vdc supplied from the first through third DC power supplies 506a, 506b and 506c, and supply the amplified signal to the power amplification section 102 as an amplitude modulated voltage Vm(t).

Based on the second modulated signal which is input from the amplitude signal control section 303 (or based on the detection result of the voltage measuring section not shown in FIG. 17 or the amplitude information from the baseband section not shown in FIG. 17), the voltage control section 506 selects the DC power supply capable of outputting a voltage which is equal to or higher than the voltage obtained as a result of adding the maximum value of the amplitude modulated voltage Vm(t) and a constant voltage. Namely, the voltage control section 506 selects the DC power supply to be used based on the maximum value of the amplitude modulated voltage Vm(t). The voltage control section 506 supplies a voltage which is output from the selected DC power supply to the corresponding series regulator in the amplitude modulated voltage supply section 505 as the supply voltage Vdc. Thus, the supply voltage Vdc controlled based on the maximum value of the amplitude modulated voltage Vm(t) can be supplied to the series regulator to be used. Therefore, a wasteful power consumption can be prevented.

As described above, according to the fifth embodiment, the voltage control section 506 supplies a supply voltage Vdc controlled based on the maximum value of the amplitude modulated voltage Vm(t) to the series regulator to be used. Therefore, the polar modulator 500 can select a DC power supply and a series regulator such that a wasteful power consumption can be prevented. Thus, the power utilization efficiency can be further improved.

In the case where the polar modulator 500 can output a signal using any of a plurality of modulation systems, the switch section 204a preferably selects a DC power supply and a series regulator in accordance with the modulation system to be used. With a different modulation system, the maximum value of the amplitude modulated voltage Vm(t) is different.

Therefore, the polar modulator 500 can further improve the efficiency by selecting the DC power supply and the series regulator in accordance with the modulation system to be used.

Sixth Embodiment

Figure 18:
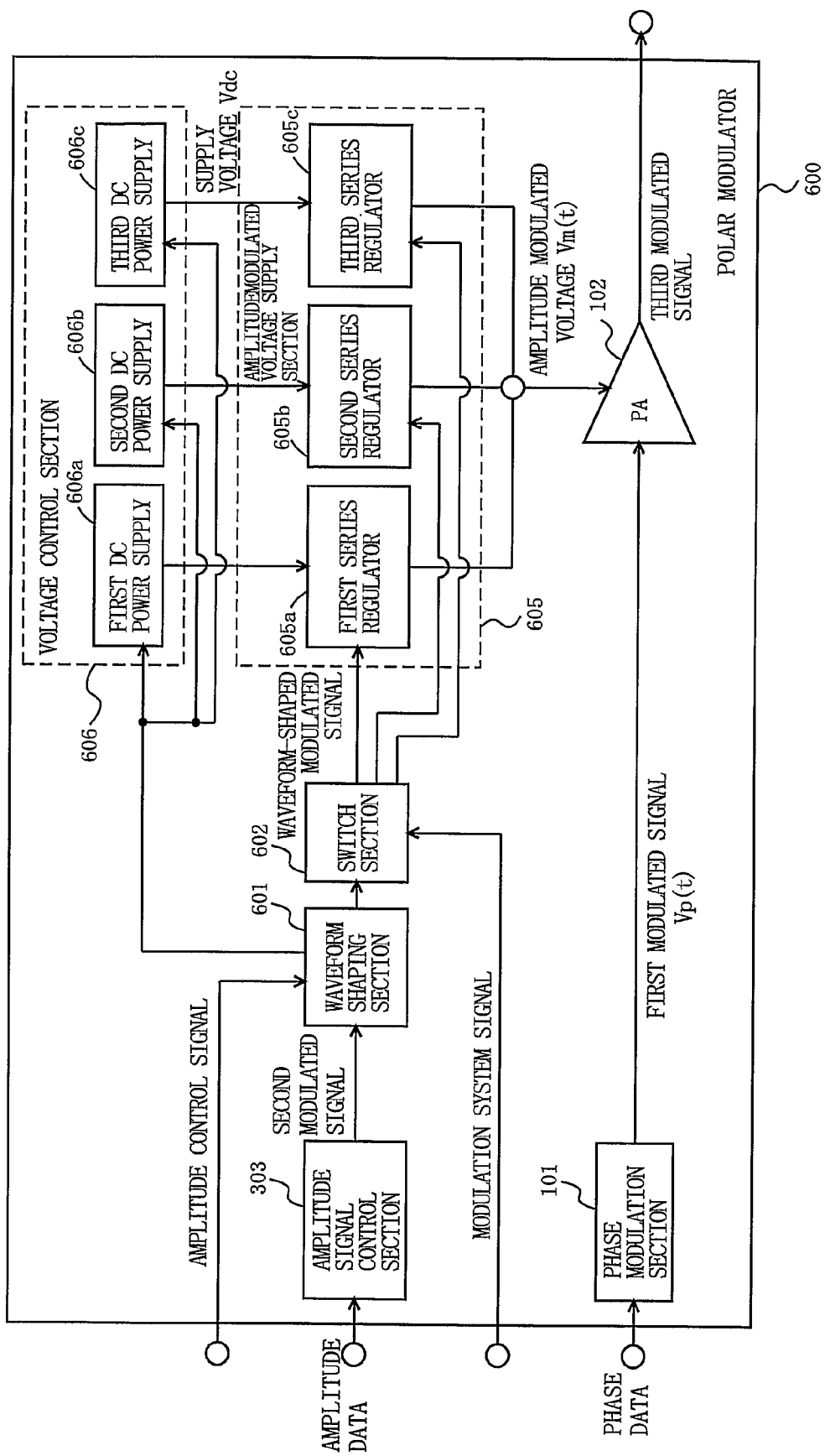
FIG. 18 is a block diagram showing a functional structure of a polar modulator 600 according to a sixth embodiment of the present invention.

FIG. 18 is a block diagram showing a functional structure of a polar modulator 600 according to a sixth embodiment of the present invention. In FIG. 18, elements having substantially identical functions to those of the fifth embodiment bear identical reference numerals thereto, and descriptions thereof will be omitted. As shown in FIG. 18, the polar modulator 600 includes a phase modulation section 101, a power amplification section 102, an amplitude signal control section 303, a waveform shaping section 601, a switch section 602, an amplitude modulated voltage supply section 605, and a voltage control section 606. The amplitude modulated voltage supply section 605 includes first through third series regulators 605a, 605b and 605c. The voltage control section 606 includes first through third DC power supplies 606a, 606b and 606c capable of outputting a plurality of different supply voltages from one another. The number of the series regulators and the DC power supplies is not limited to three as shown in FIG. 18.

The first through third series regulators 605a through 605c are respectively provided in correspondence with the first through third DC power supplies 606a through 606c. The first through third series regulators 605a through 605c respectively amplify the second modulated signal using a transistor based on the supply voltage Vdc supplied from the first through third DC power supplies 606a through 606c, and supply the amplified signal to the power amplification section 102 as an amplitude modulated voltage Vm(t).

Based on the waveform-shaped modulated signal which is input from the waveform shaping section 601 (or based on the detection result of the voltage measuring section not shown in FIG. 18), the voltage control section 606 selects the DC power supply capable of outputting a voltage which is equal to or higher than the voltage obtained as a result of adding the maximum value of the amplitude modulated voltage Vm(t) and a constant voltage. Namely, the voltage control section 606 selects the DC power supply to be used based on the maximum value of the amplitude modulated voltage Vm(t). The voltage control section 606 supplies a voltage which is output from the selected DC power supply to the corresponding series regulator in the amplitude modulated voltage supply section 605 as the supply voltage Vdc.

As described above, according to the sixth embodiment, a supply voltage Vdc controlled based on the maximum value of the amplitude modulated voltage Vm(t) can be supplied to the series regulator to be used. Therefore, a wasteful power consumption can be prevented.

In the case where the polar modulator 600 can output a signal using any of a plurality of modulation systems, the switch section 602 preferably selects a DC power supply and a series regulator in accordance with the modulation system to be used. With a different modulation system, the maximum value of the amplitude modulated voltage Vm(t) is different. Therefore, the polar modulator 600 can further improve the efficiency by selecting the DC power supply and the series regulator in accordance with the modulation system to be used.

The first through sixth embodiments can be combined in various manners, and possible combinations are not limited to those described above.

Seventh Embodiment

Figure 19:
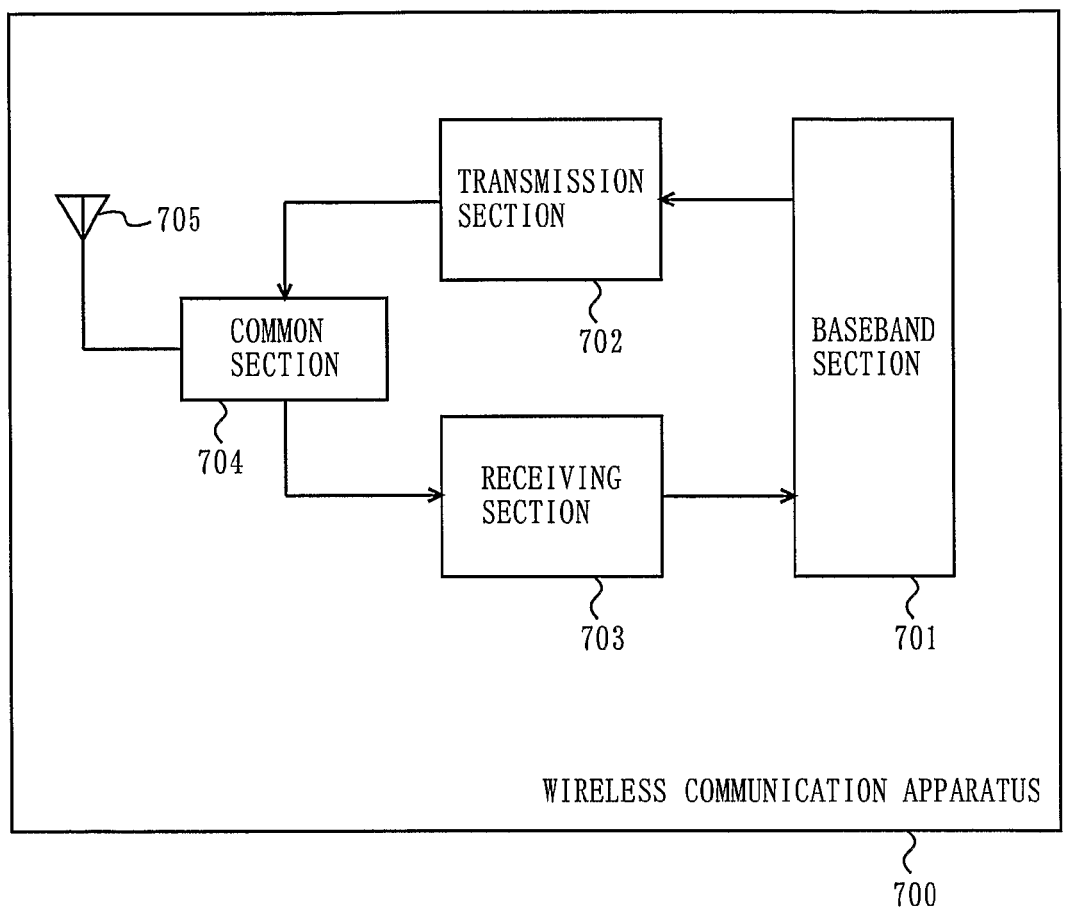
FIG. 19 is a block diagram showing a functional structure of a wireless communication apparatus 700 according to a seventh embodiment of the present invention.
Figure 2:
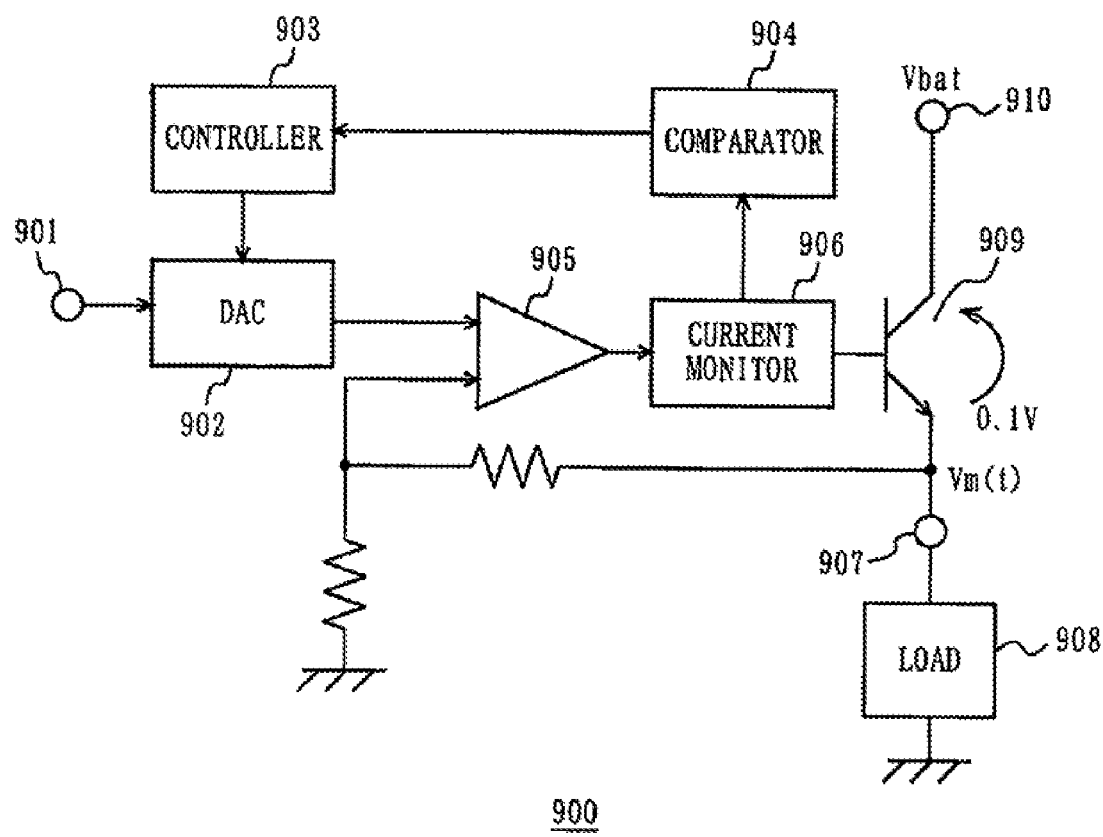
Figure 21:
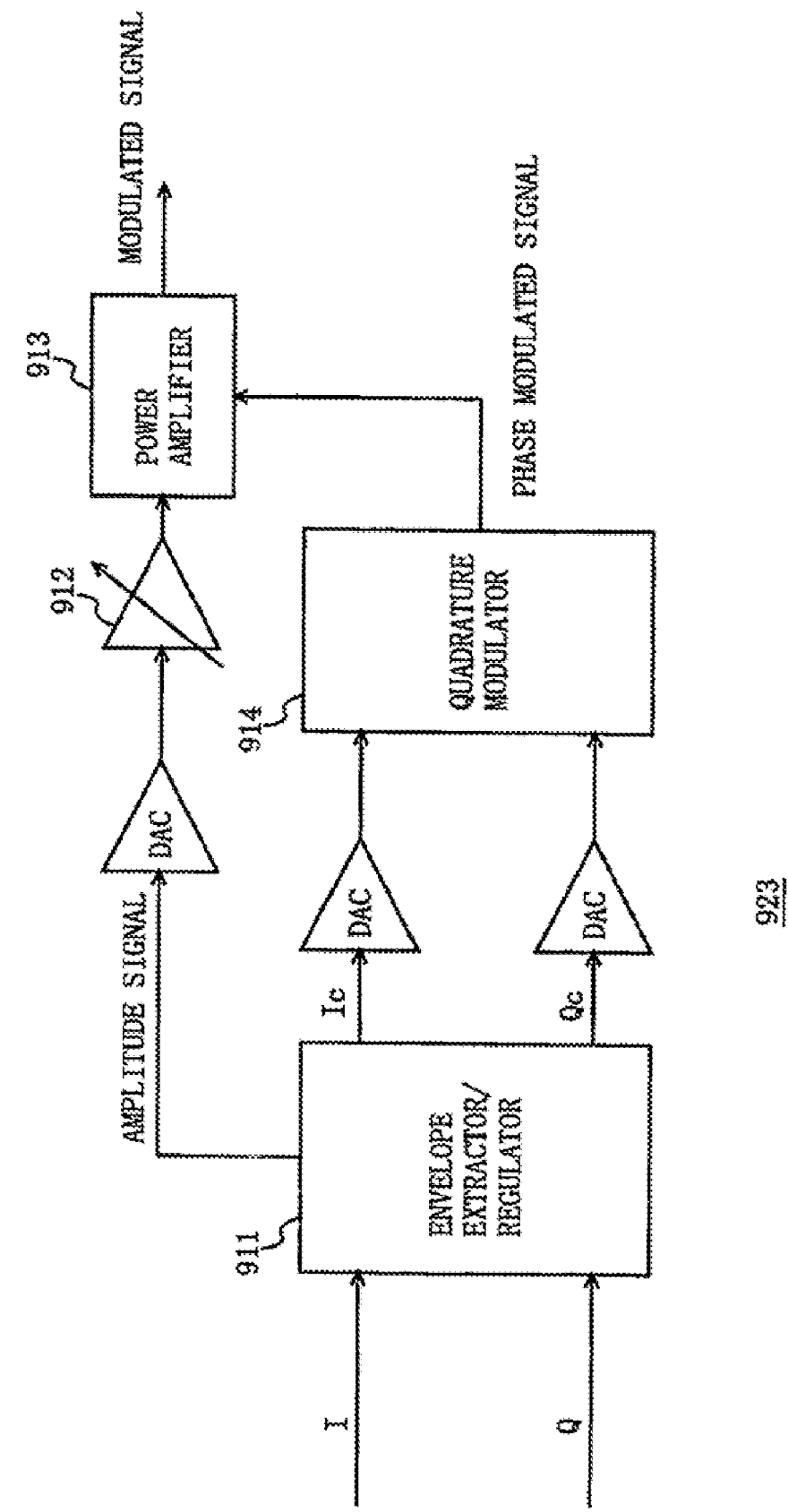
FIG. 21 is a block diagram showing a structure of a polar modulator 923 described in patent document 2.
Figure 22:
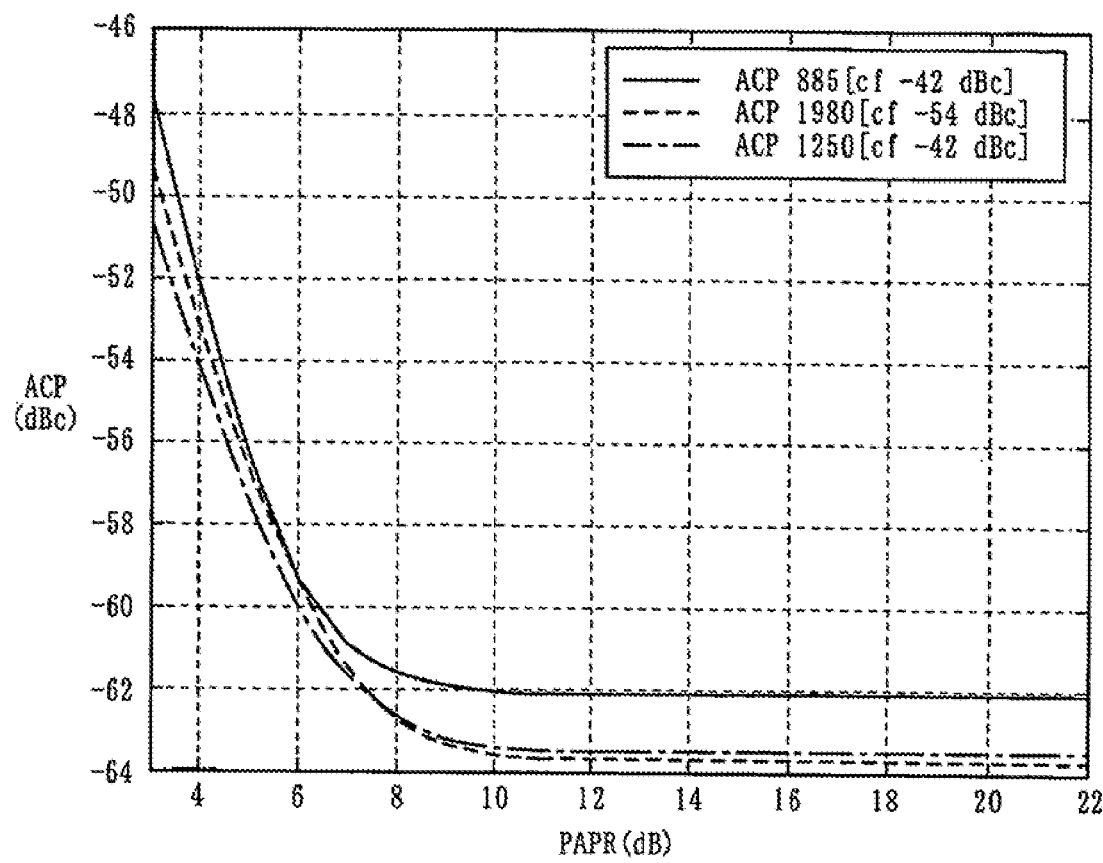
FIG. 22 is a graph illustrating the relationship between the ACP and the PAPR of an amplitude signal in an output from a cellular phone using the IS95 system.

FIG. 19 is a block diagram showing a functional structure of a wireless communication apparatus 700 according to a seventh embodiment of the present invention. As shown in FIG. 19, the wireless communication apparatus 700 includes a baseband section 701, a transmission section 702, a receiving section 703, a common section 704, and an antenna section 705.

The baseband section 701 generates and processes a baseband signal.

The transmission section 702 converts the baseband signal generated by the baseband section into a transmission signal. The transmission section 702 includes the polar modulator described above in the first through sixth embodiments. The phase modulation section of the polar modulator generates a first modulated signal including phase information from the baseband signal. The amplitude signal control section of the polar modulator generates a second modulated signal including amplitude information from the baseband signal. A third modulated signal generated by the power amplification section of the polar modulator is the transmission signal.

The common section 704 transfers the transmission signal generated by the transmission section 702 to the antenna section 705, and also transfers a receiving signal received by the antenna section 705 to the receiving section 703.

The receiving section 703 converts the receiving signal into a baseband signal and inputs the baseband signal to the baseband section.

In this manner, a wireless communication apparatus having an enlarged dynamic range and/or a wireless communication apparatus realizing at a high efficiency is provided. Thus, a long-time dialog is made possible with a limited battery capacity.

While the invention has been described in detail, the foregoing description is in all aspects illustrative and not restrictive. It is understood that numerous other modifications and variations can be devised without departing from the scope of the invention.

INDUSTRIAL APPLICABILITY

A polar modulator according to the present invention can easily realize enlargement of the dynamic range and/or a transmission circuit operable at a high efficiency, and is useful for, for example, providing a wireless communication apparatus or the like realizing a long-time dialog and reducing the size and cost of the wireless communication apparatus.

The invention claimed is:

1. A polar modulator, comprising:
a power amplification section;
a phase modulation section for generating a first modulated signal including phase information;
an amplitude signal control section for generating a second modulated signal including amplitude information;
a waveform shaping section for, when an amplitude of the second modulated signal is larger than a predetermined regulated value, generating a waveform-shaped modulated signal obtained as a result of shaping a waveform of the second modulated signal, such that the amplitude of a portion of the second modulated signal which exceeds the predetermined regulated value becomes equal to or smaller than the predetermined regulated value;
a voltage control section for outputting a supply voltage; and
an amplitude modulated voltage supply section for amplifying the waveform-shaped modulated signal using a transistor based on the supply voltage which is output from the voltage control section and for supplying the amplified signal to the power amplification section as an amplitude modulated voltage;

wherein:

the power amplification section amplifies the first modulated signal based on the amplitude modulated voltage, and thus outputs a third modulated signal obtained as a result of modulating an amplitude of the first modulated signal; and the waveform shaping section adjusts the predetermined regulated value in accordance with a factor for changing a distorted power generated by the power amplification section, such that an adjacent channel leakage power generated in the power amplification section becomes equal to or smaller than a first predetermined value, or such that a power at a receiving band becomes equal to or smaller than a second predetermined value.

2. The polar modulator according to claim 1, wherein:

a power value of the first modulated signal is a factor for changing the distorted power generated by the power amplification section; and the waveform shaping section adjusts the predetermined regulated value in accordance with the power value of the first modulated signal.

3. The polar modulator according to claim 1, wherein:

an amplitude value of the second modulated signal is a factor for changing the distorted power generated by the power amplification section; and the waveform shaping section adjusts the predetermined regulated value in accordance with the amplitude value of the second modulated signal.

4. The polar modulator according to claim 1, wherein:

a combination of a gain shown in a control channel and a gain shown in a data channel is a factor for changing a peak to average power ratio (PAPR); and the waveform shaping section adjusts the predetermined regulated value in accordance with the combination of the gain shown in the control channel and the gain shown in the data channel.

5. The polar modulator according to claim 1, wherein:

a number of sub carriers to be used is a factor for changing a peak to average power ratio (PAPR); and the waveform shaping section changes the number of the sub carriers to be used or a modulation system to be used.

6. The polar modulator according to claim 1, wherein:

the polar modulator is capable of outputting a signal using any of a plurality of modulation systems;

a modulation system to be used is a factor for changing a peak to average power ratio (PAPR); and the waveform shaping section adjusts the predetermined regulated value in accordance with the modulation system to be used.

7. The polar modulator according to claim 1, further comprising a memory section for storing the predetermined regulated value which is set by the waveform shaping section;

wherein the waveform shaping section reads the predetermined regulated value from the memory section and thus adjusts the predetermined regulated value.

8. The polar modulator according to claim 7, wherein the memory section has step-by-step regulated values stored therein in correspondence with a plurality of different output powers from the power amplification section.

9. The polar modulator according to claim 1, wherein:

the voltage control section includes a plurality of DC power supplies capable of outputting a plurality of different supply voltages from one another;

the amplitude modulated voltage supply section includes a plurality of series regulators respectively provided in correspondence with the plurality of DC power supplies, each of the plurality of series regulators being for amplifying the waveform-shaped modulated signal using the transistor based on the corresponding supply voltage and for supplying the amplified signal to the power amplification section as the amplitude modulated voltage; and the polar modulator further comprises a switch section for inputting the waveform-shaped modulated signal generated by the waveform shaping section to any one of the plurality of series regulators.

10. The polar modulator according to claim 9, wherein:

the polar modulator is capable of outputting a signal using any of a plurality of modulation systems;

the modulation system to be used is a factor for changing the distorted power generated by the power amplification section;

the waveform shaping section adjusts the predetermined regulated value in accordance with the modulation system to be used; and the switching section selects the series regulator, to which the waveform-shaped modulated signal is to be input, in accordance with the modulation system to be used.

11. A polar modulator, comprising:

a power amplification section;

a phase modulation section for generating a first modulated signal including phase information;

an amplitude signal control section for generating a second modulated signal including amplitude information;

a voltage control section for outputting a supply voltage; and an amplitude modulated voltage supply section for amplifying the second modulated signal using a transistor based on the supply voltage which is output from the voltage control section and for supplying the amplified signal to the power amplification section as an amplitude modulated voltage;

wherein:

the power amplification section amplifies the first modulated signal based on the amplitude modulated voltage, and thus outputs a third modulated signal obtained as a result of modulating an amplitude of the first modulated signal; and the voltage control section supplies a voltage, obtained based on a maximum value of the amplitude modulated voltage which is output from the transistor, to the amplitude modulated voltage supply section as the supply voltage.

12. The polar modulator according to claim 11, wherein:

the voltage control section is a switching regulator;

the switching regulator is provided with a voltage from a battery; and the voltage control section supplies a voltage, which is higher than a voltage obtained as a result of adding the maximum value of the amplitude modulated voltage and a constant voltage determined based on a saturation voltage of the transistor and which is lower than the voltage provided from the battery, to the amplitude modulated voltage supply section as the supply voltage.

13. The polar modulator according to claim 11, further comprising a voltage measuring section for detecting the maximum value of the amplitude modulated voltage which is output from the amplitude modulated voltage supply section;

wherein the voltage control section supplies the supply voltage, obtained based on the maximum value of the amplitude modulated voltage detected by the voltage measuring section, to the amplitude modulated voltage supply section.

14. The polar modulator according to claim 11, wherein the voltage control section obtains the maximum value of the amplitude modulated voltage based on the amplitude information, and supplies a voltage, obtained based on the obtained maximum value, to the amplitude modulated voltage supply section as the supply voltage.

15. The polar modulator according to claim 11, wherein the voltage control section supplies a voltage, obtained as a result of adding the maximum value of the amplitude modulated voltage and a constant voltage determined based on the saturation voltage of the transistor, to the amplitude modulated voltage supply section as the supply voltage.

16. The polar modulator according to claim 11, further comprising a waveform shaping section for, when an amplitude of the second modulated signal is larger than a predetermined regulated value, generating a waveform-shaped modulated signal obtained as a result of shaping a waveform of the second modulated signal, such that the amplitude of a portion of the second modulated signal which exceeds the predetermined regulated value becomes equal to or smaller than the predetermined regulated value;

wherein the amplitude modulated voltage supply section amplifies the waveform-shaped modulated signal, instead of the second modulated signal, using the transistor, and supplies the amplified signal to the power amplification section as the amplitude modulated voltage.

17. The polar modulator according to claim 16, wherein the voltage control section supplies a voltage, obtained as a result of adding the predetermined regulated value and a constant voltage determined based on the saturation voltage of the transistor, to the amplitude modulated voltage supply section as the supply voltage.

18. The polar modulator according to claim 16, wherein the waveform shaping section adjusts the predetermined regulated value in accordance with a factor for changing a distorted power generated by the power amplification section, such that an ACP generated in the power amplification section becomes equal to or smaller than a first predetermined value, or such that a power at a receiving band becomes equal to or smaller than a second predetermined value.

19. The polar modulator according to claim 11, wherein:
the voltage control section includes a plurality of DC power supplies capable of outputting a plurality of different supply voltages from one another;
the amplitude modulated voltage supply section includes a plurality of series regulators respectively provided in correspondence with the plurality of DC power supplies, each of the plurality of series regulators being for amplifying the second modulated signal using the transistor based on the corresponding supply voltage and for supplying the amplified signal to the power amplification section as the amplitude modulated voltage;
the polar modulator further comprises a switch section for inputting the second modulated signal to any one of the plurality of series regulators; and
the voltage control section selects the DC power supply to be used based on the maximum value of the amplitude modulated voltage which is output from the transistor included in the series regulator to be used, and supplies a voltage, which is output from the DC power supply to be used, to the amplitude modulated voltage supply section as the supply voltage.

20. The polar modulator according to claim 19, wherein:
the polar modulator is capable of outputting a signal using any of a plurality of modulation systems; and
the switch section selects the series regulator, to which the second modulated signal is to be input, in accordance with the modulation system to be used.

21. A polar modulator, comprising:
a power amplification section;
a phase modulation section for generating a first modulated signal including phase information;
an amplitude signal control section for generating a second modulated signal including amplitude information;
a voltage control section for outputting a supply voltage; and
an amplitude modulated voltage supply section for amplifying the second modulated signal using a transistor based on the supply voltage which is output from the voltage control section and for supplying the amplified signal to the power amplification section as an amplitude modulated voltage;

wherein:
the power amplification section amplifies the first modulated signal based on the amplitude modulated voltage, and thus outputs a third modulated signal obtained as a result of modulating an amplitude of the first modulated signal; and
the voltage control section supplies the supply voltage, at which the transistor is operated in a constant current region, to the amplitude modulated voltage supply section.

22. The polar modulator according to claim 21, wherein when the transistor is a bipolar transistor, the constant current region is a non-saturation region.

23. The polar modulator according to claim 21, wherein when the transistor is a MOS transistor, the constant current region is a saturation region.

24. The polar modulator according to claim 21, further comprising a waveform shaping section for, when an amplitude of the second modulated signal is larger than a predetermined regulated value, generating a waveform-shaped modulated signal obtained as a result of shaping a waveform of the second modulated signal, such that the amplitude of a portion of the second modulated signal which exceeds the predetermined regulated value becomes equal to or smaller than the predetermined regulated value;

wherein the amplitude modulated voltage supply section amplifies the waveform-shaped modulated signal, instead of the second modulated signal, using the transistor, and supplies the amplified signal to the power amplification section as the amplitude modulated voltage.

25. The polar modulator according to claim 24, wherein the voltage control section supplies a voltage, obtained as a result of adding the predetermined regulated value and a constant voltage obtained based on a saturation voltage of the transistor, to the amplitude modulated voltage supply section as the supply voltage.

26. The polar modulator according to claim 24, wherein the waveform shaping section adjusts the predetermined regulated value in accordance with a factor for changing a distorted power generated by the power amplification section, such that an ACP generated in the power amplification section becomes equal to or smaller than a first predetermined value, or such that a power at a receiving band becomes equal to or smaller than a second predetermined value.

27. The polar modulator according to claim 21, wherein:
the voltage control section includes a plurality of DC power supplies capable of outputting a plurality of different supply voltages from one another;
the amplitude modulated voltage supply section includes a plurality of series regulators respectively provided in correspondence with the plurality of DC power supplies, each of the plurality of series regulators being for amplifying the second modulated signal using the transistor based on the corresponding supply voltage and for supplying the amplified signal to the power amplification section as the amplitude modulated voltage;
the polar modulator further comprises a switch section for inputting the second modulated signal to any one of the plurality of series regulators; and
the voltage control section selects the DC power supply to be used based on the maximum value of the amplitude modulated voltage which is output from the transistor included in the series regulator to be used, and supplies a voltage, which is output from the DC power supply to be used, to the amplitude modulated voltage supply section as the supply voltage.

28. The polar modulator according to claim 27, wherein:
the polar modulator is capable of outputting a signal using any of a plurality of modulation systems; and
the switch section selects the series regulator, to which the second modulated signal is to be input, in accordance with the modulation system to be used.

29. A wireless communication apparatus using a battery as a power supply, comprising:
a baseband section for generating and processing a baseband signal;
a transmission section for converting the baseband signal generated by the baseband section into a transmission signal;
an antenna section for receiving a receiving signal;
a receiving section for converting the receiving signal into a baseband signal and inputting the baseband signal to the baseband section; and
a common section for transferring the transmission signal to the antenna section and transferring the receiving signal to the receiving section;
wherein:
the transmission section includes a polar modulator for converting the baseband signal into the transmission signal; and
the polar modulator comprises:
a power amplification section;
a phase modulation section for generating a first modulated signal including phase information from the baseband signal;
an amplitude signal control section for generating a second modulated signal including amplitude information from the baseband signal;
a waveform shaping section for, when an amplitude of the second modulated signal is larger than a predetermined regulated value, generating a waveform-shaped modulated signal obtained as a result of shaping a waveform of the second modulated signal, such that the amplitude of a portion of the second modulated signal which exceeds the predetermined regulated value becomes equal to or smaller than the predetermined regulated value;
a voltage control section for outputting a supply voltage; and an amplitude modulated voltage supply section for amplifying the waveform-shaped modulated signal using a transistor based on the supply voltage which is output from the voltage control section and for supplying the amplified signal to the power amplification section as an amplitude modulated voltage;
wherein:
the power amplification section amplifies the first modulated signal based on the amplitude modulated voltage, and thus outputs a third modulated signal obtained as a result of modulating an amplitude of the first modulated signal; and
the waveform shaping section adjusts the predetermined regulated value in accordance with a factor for changing a distorted power generated by the power amplification section, such that an adjacent channel leakage power generated in the power amplification section becomes equal to or smaller than a first predetermined value, or such that a power at a receiving band becomes equal to or smaller than a second predetermined value.

30. A wireless communication apparatus using a battery as a power supply, comprising:
a baseband section for generating and processing a baseband signal;
a transmission section for converting the baseband signal generated by the baseband section into a transmission signal;
an antenna section for receiving a receiving signal;
a receiving section for converting the receiving signal into a baseband signal and inputting the baseband signal to the baseband section; and
a common section for transferring the transmission signal to the antenna section and transferring the receiving signal to the receiving section;
wherein:
the transmission section includes a polar modulator for converting the baseband signal into the transmission signal; and
the polar modulator comprises:
a power amplification section;
a phase modulation section for generating a first modulated signal including phase information from the baseband signal;
an amplitude signal control section for generating a second modulated signal including amplitude information from the baseband signal;
a voltage control section for outputting a supply voltage; and
an amplitude modulated voltage supply section for amplifying the second modulated signal using a transistor based on the supply voltage which is output from the voltage control section and for supplying the amplified signal to the power amplification section as an amplitude modulated voltage;
wherein:
the power amplification section amplifies the first modulated signal based on the amplitude modulated voltage, and thus outputs a third modulated signal obtained as a result of modulating an amplitude of the first modulated signal; and
the voltage control section supplies a voltage, obtained based on a maximum value of the amplitude modulated voltage which is output from the transistor, to the amplitude modulated voltage supply section as the supply voltage.

31. A wireless communication apparatus using a battery as a power supply, comprising:

a baseband section for generating and processing a baseband signal;

a transmission section for converting the baseband signal generated by the baseband section into a transmission signal;

an antenna section for receiving a receiving signal;

a receiving section for converting the receiving signal into a baseband signal and inputting the baseband signal to the baseband section; and a common section for transferring the transmission signal to the antenna section and transferring the receiving signal to the receiving section;

wherein:

the transmission section includes a polar modulator for converting the baseband signal into the transmission signal; and the polar modulator comprises:

a power amplification section;

a phase modulation section for generating a first modulated signal including phase information from the baseband signal;

an amplitude signal control section for generating a second modulated signal including amplitude information from the baseband signal;

a voltage control section for outputting a supply voltage; and an amplitude modulated voltage supply section for amplifying the second modulated signal using a transistor based on the supply voltage which is output from the voltage control section and for supplying the amplified signal to the power amplification section as an amplitude modulated voltage;

wherein:

the power amplification section amplifies the first modulated signal based on the amplitude modulated voltage, and thus outputs a third modulated signal obtained as a result of modulating an amplitude of the first modulated signal; and the voltage control section supplies the supply voltage, at which the transistor is operated in a constant current region, to the amplitude modulated voltage supply section.

* * * * *